United States Patent [19]
Takahashi

[11] Patent Number: 6,118,150
[45] Date of Patent: *Sep. 12, 2000

[54] INSULATED GATE SEMICONDUCTOR DEVICE AND METHOD OF MANUFACTURING THE SAME

[75] Inventor: Hideki Takahashi, Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/717,722

[22] Filed: Sep. 23, 1996

[30] Foreign Application Priority Data

Apr. 1, 1996 [JP] Japan ..................... 8-078674

[51] Int. Cl.[7] .................................................. H01L 29/76
[52] U.S. Cl. ..................... 257/341; 257/331; 257/146; 257/147; 257/139
[58] Field of Search .................................. 257/341, 331, 257/146, 147, 139

[56] References Cited

U.S. PATENT DOCUMENTS

| | | |
|---|---|---|
| 5,072,266 | 12/1991 | Bulucea et al. . |
| 5,169,793 | 12/1992 | Okabe et al. . |
| 5,208,471 | 5/1993 | Mori et al. . |
| 5,298,442 | 3/1994 | Bulucea et al. . |
| 5,714,775 | 2/1998 | Inoue ...................................... 257/139 |

FOREIGN PATENT DOCUMENTS

| | | |
|---|---|---|
| 0 527 600 | 2/1993 | European Pat. Off. . |
| 1-198076 | 8/1989 | Japan . |
| 6-45612 | 2/1994 | Japan . |
| 7-235672 | 9/1995 | Japan . |
| 2 269 050 | 1/1994 | United Kingdom . |

OTHER PUBLICATIONS

Proceedings of the International Symposium on Power Semiconductor Devices, pp. 411–416, May 31–Jun. 2, 1994, M. Harada, et al., "600V Trench IGBT in Comparison With Planar IGBT—An Evaluation of the Limit of IGBT Performance".

Primary Examiner—Jerome Jackson, Jr.
Attorney, Agent, or Firm—Oblon, Spivak, McClelland, Maier & Neustadt, P.C.

[57] ABSTRACT

The RBSOA of a device is improved. A gate electrode (10) is linked to a p base layer (4) which is formed in a cell region (CR), and a p semiconductor layer (13) is formed to surround the cell region (CR). An emitter electrode (11) is connected to a top surface of a side diffusion region (SD) of the p semiconductor layer (13) and to a top surface of a margin region (MR) which is adjacent to the side diffusion region (SD), through a contact hole (CH). Further, in these regions, an $n^+$ emitter layer (5) is not formed. Most of avalanche holes (H) which are created in the vicinity of the side diffusion region (SD) when a high voltage is applied pass through the side diffusion region (SD), while some of the avalanche holes (H) pass through the margin region (MR) and are then ejected to the emitter electrode (11). Since there is no $n^+$ emitter layer (5) in these paths, a flow of the holes (H) does not conduct a parasitic bipolar transistor. As a result of this, the RBSOA is improved.

10 Claims, 23 Drawing Sheets

INSULATED GATE SEMICONDUCTOR DEVICE AND METHOD OF MANUFACTURING THE SAME

BACKGROUND OF THE INVENTION

1. Field of the Invention

The present invention relates to an insulated gate semiconductor device having a trench gate, and more particularly, to an improvement for improving an RBSOA.

2. Description of the Prior Art

An insulated gate semiconductor device is a semiconductor device having a structure in which gate electrodes are faced with a semiconductor layer disposed for creating a channel through an insulation film. An insulated gate bipolar transistor (hereinafter "IGBT") and a MOS transistor are typical examples of such an insulated gate semiconductor device. In a generally popular structure of an insulated gate semiconductor device, a number of unit cells which are connected parallel to each other are formed in a single semiconductor substrate, to obtain a large main current.

In particular, an insulated gate semiconductor device having a trench gate, that is, a device which is structured so that a gate electrode is buried in a trench which is formed in one major surface of a semiconductor base is attracting an attention as an excellent device which is advantageous in that it is possible to increase the integration degree of the device, since it is easy to miniturize the unit cells in such a device.

FIG. 29 is a cross sectional view of a conventional insulated gate bipolar transistor having a trench gate (hereinafter "trench IGBT"), which serves as the background of the present invention. In a conventional device 151, a $p^+$ collector layer 1, an $n^+$ buffer layer 2, and an $n^-$ semiconductor layer 3 are sequentially stacked in this order in a silicon semiconductor base which is formed as a flat plate. Within a cell region CR of the semiconductor base, a number of trenches 7 are formed parallel to each other with a certain distance $W_{cel}$ from each other in a top major surface of the semiconductor base (i.e., a major surface in which the $n^-$ semi conductor layer 3 is formed).

Further, in the cell region CR, a p base layer 4 is formed in a surface portion of the $n^-$ semiconductor layer 3. Still further, in a surface portion of the p base layer 4, an $n^+$ emitter layer 5 is selectively formed so as to be adjacent to side walls of the trenches 7. Gate insulation films 8 are formed on inner surfaces of the trenches 7, and a gate electrode (i.e., trench gate) 10 is buried inside the gate insulation films 8. A region of the p base layer 4 which is faced with the gate electrode 10 and is between the $n^+$ emitter layer 5 and the $n^-$ semiconductor layer 3 functions as a channel region.

The cell region CR is surrounded by a gate wire region GR. In the gate wire region GR, a gate wire line GL is disposed on the top major surface of the semiconductor base through an insulation film 17. In a top major surface portion of the $n^-$ semiconductor layer 3 including a region which is immediately under the gate wire line GL, a p semiconductor layer 13 is selectively formed. The p semiconductor layer 13 is formed to maintain the breakdown voltage of the device 151 high. To achieve this object, the p semiconductor layer 13 is formed deeper than the p base layer 4.

In regions between the adjacent trenches 7 in the top major surface of the semiconductor base, an emitter electrode 11 is connected to both the p base layer 4 and the $n^+$ emitter layer 5. An insulation layer 9 exists between the emitter electrode 11 and the gate electrode 10 and between the emitter electrode 11 and the gate wire line GL. The insulation layer 9 maintains electric insulation between these elements.

A collector electrode 12 is connected to a bottom major surface of the semiconductor base, that is, a surface of the $p^+$ collector layer 1. The emitter electrode 11 and the collector electrode 12 serve as a pair of main electrodes.

In a condition where a positive collector voltage $V_{CE}$ is applied across the collector electrode 12 and the emitter electrode 11, when a positive gate voltage $V_{GE}$ exceeding a predetermined gate threshold voltage $V_{GE(th)}$ is applied across the gate electrode 10 and the emitter electrode 11, the channel region is reversed from the p type to the n type. As a result, electrons are injected into the $n^-$ semiconductor layer 3 from the emitter electrode 11 through the $n^+$ emitter layer 5.

As the injected electrons forwardly bias across the $p^+$ collector layer 1 and the $n^-$ semiconductor layer 3 (including the $n^+$ buffer layer 2), holes are injected into the $n^-$ semiconductor layer 3 from the $p^+$ collector layer 1. Since this greatly reduces the resistance of the $n^-$ semiconductor layer 3, a large collector current (which is a main current) flows from the collector electrode 12 to the emitter electrode 11.

Next, if the gate voltage $V_{GE}$ is returned to zero or a negative value, a channel region 6 returns to the p type. As this stops injection of electrons from the emitter electrode 11, injection of holes from the $p^+$ collector layer 1 stops. Following this, electrons and holes staying within the $n^-$ semiconductor layer 3 (and the $n^+$ buffer layer 2) are collected to the collector electrode 12 and the emitter electrode 11, or re-combined with each other and disappear.

By the way, as clearly shown in FIG. 29, a bipolar transistor which is formed by the $n^+$ emitter layer 5, the p base layer 4, and the $n^-$ semiconductor layer 3 exists within an IGBT, in general, as a parasitic transistor. A hole current flowing in the p base layer 4 behaves as if it is a base current of the parasitic bipolar transistor. Hence, if the hole current flowing in the p base layer 4 exceeds a certain value, the parasitic bipolar transistor conducts (i.e., turns on).

Once the parasitic bipolar transistor conducts a parasitic thyristor which is formed by the $n^+$ emitter layer 5, the p base layer 4, the $n^-$ semiconductor layer 3 and the $p^+$ collector layer 1 also conducts. Conduction of the parasitic thyristor is called "latch-up." Once the IGBT is latched up, the main current (i.e., collector current) flowing between the emitter electrode 11 from the collector electrode 12 keeps flowing, now independently of the gate voltage $V_{GE}$. That is, it becomes impossible to control the collector current by means of the gate voltage $V_{GE}$. This leads to destruction of the IGBT.

In the case of a trench IGBT, destruction due to latching up tends to occur at a particular portion of the semiconductor base, during a particular operation. For instance, when an induction load (hereinafter "L load") is connected to the main electrodes and a large main current flows, latching up easily occurs. The extent of the ability of blocking a main current, which flows while the device is in an ON-state, when the device switches to an OFF-state is evaluated by a known RBSOA (Reverse Bias Safe Operation Area). Needless to mention, it is desirable that a large main current can be blocked, in other words, that the RBSOA is large.

FIG. 30 is a graph schematically showing changes in a collector current $I_c$ and the collector voltage $V_{CE}$ during transition of the IGBT from the ON-state to the OFF-state with an L load connected. With the L load connected, when the collector current $I_c$ decreases, inductive electromotive force which is expressed as $\{-L \cdot d\, I_c/dt\}$ is generated across the L load where L denotes the force of induction of the L load.

A voltage which is equal to the sum of a d.c. power source voltage which is supplied from an external power source and this inductive electromotive force, is applied across the emitter electrode 11 and the collector electrode 12, as the collector voltage $V_{CE}$. As a result, as shown in FIG. 30, during transition of the IGBT from the ON-state to the OFF-state, a surge voltage appears in the collector voltage $V_{CE}$.

As shown in FIG. 30, when a power source voltage which is equivalent to a rated voltage of the IGBT is supplied and the value of the collector current $I_c$ during the device ON-state corresponds to a rated current, the surge voltage excessively applies the collector voltage $V_{CE}$, whereby an avalanche current is generated within the semiconductor base.

The avalanche current serves as a base current of the parasitic bipolar transistor described above. Hence, when the avalanche current which is equal to or larger than a certain value flows in the p base layer 4 in which the $n^+$ emitter layer 5 exists, the parasitic bipolar transistor turns on, thereby destroying the IGBT. The avalanche current destroying the IGBT is developed in a portion of the semiconductor base with concentrated electric field, that is, a portion where electric field becomes strongest as a result of the application of the collector voltage $V_{CE}$.

In general, electric field is concentrated at an extruded portion or a portion which is strongly warped. Hence, in general, electric field tends to concentrate around bottom portions of the trenches 7 or a side diffusion region which forms both end portions of the p semiconductor layer 13. However, in the device 151 which is shown in FIG. 29, the distance $W_{cel}$ is set sufficiently small in order to sufficiently weaken electric field which is developed around the bottom portions of the trenches 7. Therefore, in the cell region CR, electric field is relatively weak. Further, since a guard ring 14 for weakening electric field is disposed around the p semiconductor layer 13, strong electric field is not developed in the side diffusion region of the p semiconductor layer 13 facing the guard ring 14.

Hence, in the device 151, electric field is strongest in the side diffusion region of the p semiconductor layer 13 facing the cell region CR. FIG. 31 is an expanded cross sectional view expanding a vicinity of such a side diffusion region. As shown in FIG. 31, in a region which is close to a boundary between the side diffusion region and the $n^-$ semiconductor layer 3, i.e., in a region where electric field is concentrated most strongly, an avalanche current is generated. In other words, pairs of holes H and electrons E are created.

Of these, the holes H flow into the emitter electrode 11 through the p base layer 4 which is in the vicinity of the p semiconductor layer 13, after passing through the $n^-$ semiconductor layer 3. At this stage, the flow of the holes H contributes as the base current of the parasitic bipolar transistor. Hence, when the avalanche current becomes large exceeding a certain limit, the parasitic bipolar transistor turns on. As a result, the device 151 is latched up, and is eventually destroyed.

As described above, in the conventional device 151, the avalanche current which is created in the side diffusion region of the p semiconductor layer 13 facing the cell region CR is a cause of latching up, and the RBSOA of the device is restricted by the avalanche current which is created in this side diffusion region.

SUMMARY OF THE INVENTION

A first aspect of the present invention is directed to an insulated gate semiconductor device comprising a semiconductor base defining a top major surface and a bottom major surface. In the insulated gate semiconductor device, the semiconductor base includes: a first semiconductor layer of a first conductivity type being exposed to the top major surface; a second semiconductor layer of a second conductivity type, being formed in a portion of the top major surface within the first semiconductor layer; a third semiconductor layer of the second conductivity type formed in a portion of the top major surface within the first semiconductor layer by selectively diffusing an impurity, the third semiconductor layer being deeper than the second semiconductor layer, the third semiconductor layer being linked to the second semiconductor layer, the third semiconductor layer surrounding the second semiconductor layer; and a fourth semiconductor layer of the first conductivity type being selectively formed in a portion of the top major surface within the second semiconductor layer. In the semiconductor base, a trench is formed which is open in the top major surface, which penetrates the fourth and the second semiconductor layers and which reaches the first semiconductor layer. The device further comprises: a gate insulation film which ensures electric insulation, the gate insulation film covering an inner wall of the trench; a gate electrode which is buried within the trench, with the gate insulation film located between the gate electrode and the semiconductor base; a gate wire line which is disposed on the top major surface through an insulation film so as to extend along the third semiconductor layer, the gate wire line being electrically connected to the gate electrode; a first major electrode which is disposed on the top major surface, the first major electrode being electrically connected to the second and the fourth semiconductor layers; and a second major electrode which is disposed on the bottom major surface, the second major electrode being electrically connected to the bottom major surface. The first major electrode is also electrically connected to a side diffusion region which is adjacent to the second semiconductor layer within the third semiconductor layer. The fourth semiconductor layer is not formed within the side diffusion region.

According to a second aspect of the present invention, in the insulated gate semiconductor device of the first aspect, the first major electrode is also electrically connected to a margin region which is defined as a region within a certain distance from the side diffusion region in the second semiconductor layer, and the fourth semiconductor layer is not formed within the margin region, either.

According to a third aspect of the present invention, in the insulated gate semiconductor device of the second aspect, the certain distance is approximately equal to or smaller than 50 $\mu$m.

According to a fourth aspect of the present invention, in the insulated gate semiconductor device of the first aspect, the trench is divided into a plurality of unit trenches which are arranged parallel to each other and equidistant from each other.

According to a fifth aspect of the present invention, in the insulated gate semiconductor device of the fourth aspect, at least one of the plurality of unit trenches which is located at an end of arrangement of the plurality of unit trenches is formed within the third semiconductor layer.

According to a sixth aspect of the present invention, in the insulated gate semiconductor device of the first aspect, an edge portion of the trench along the longitudinal direction of the trench extends into the third semiconductor layer.

According to a seventh aspect of the present invention, the insulated gate semiconductor device of the first aspect, the semiconductor base further includes a fifth semiconductor layer which is selectively formed in a connection portion of the second and the third semiconductor layers with the first major electrode, the fifth semiconductor layer having a higher impurity concentration than those of the second and the third semiconductor layers.

An eighth aspect of the present invention is directed to a method of manufacturing an insulated gate semiconductor device, comprising the steps of: (a) preparing a semiconductor base defining a top major surface and a bottom major surface, the semiconductor base including a first semiconductor layer of a first conductivity type which is exposed to the top major surface; (b) selectively introducing a second conductivity type impurity into the top major surface to thereby form a second semiconductor layer and a third semiconductor layer of a second conductivity type in a portion of the top major surface within the first semiconductor layer, so that the third semiconductor layer is deeper than the second semiconductor layer and the third semiconductor layer is linked to the second semiconductor layer and surrounds the second semiconductor layer; (c) selectively introducing a first conductivity type impurity into the top major surface to thereby selectively form a fourth semiconductor layer of the first conductivity type, in a portion of the top major surface within the second semiconductor layer except at a side diffusion region which is adjacent to the second semiconductor layer within the third semiconductor layer; (d) selectively etching from the top major surface to thereby selectively form a trench in the semiconductor base which penetrates the fourth and the second semiconductor layers and reaches the first semiconductor layer; (e) forming an insulation film which covers an inner wall of the trench and a top surface of the semiconductor base; (f) forming a conductive layer to coat the insulation film; (g) selectively removing the conductive layer to leave an inner portion of the trench and a portion which is along the third semiconductor layer, to thereby form a gate electrode and a gate wire line; (h) forming a first major electrode on the top major surface, the first major electrode being electrically connected to the second and the fourth semiconductor layers and also to said side diffusion region; and (i) forming a second major electrode which is electrically connected to the bottom major surface.

According to a ninth aspect of the present invention, in the method of manufacturing an insulated gate semiconductor device of the eighth aspect, at the step (c), the fourth semiconductor layer is formed except at a margin region which is defined as a region within a certain distance from the side diffusion region in the second semiconductor layer, and at the step (h), the first major electrode is also electrically connected to the margin region.

According to tenth aspect of the present invention, in the method of manufacturing an insulated gate semiconductor device of the ninth aspect, at said step (c), the certain distance is set equal to or smaller than 50 $\mu$m.

According to a eleventh aspect of the present invention, in the method of manufacturing an insulated gate semiconductor device of the eighth aspect, at the step (d), the trench is formed as a plurality of unit trenches which are arranged parallel to each other and equidistant from each other.

According to an twelfth aspect of the present invention, in the method of manufacturing an insulated gate semiconductor device of the eleventh aspect, at the step (d), at least one of the plurality of unit trenches is formed in the side diffusion region as well.

According to thirteenth aspect of the present invention, in the method of manufacturing an insulated gate semiconductor device of the eighth aspect, at said step (d), the trench is so formed that an edge portion of the trench along the longitudinal direction of the trench extends into the third semiconductor layer.

According to a fourteenth aspect of the present invention, the method of manufacturing an insulated gate semiconductor device of the eighth aspect further comprises a step (j) of selectively introducing a second conductivity type impurity into the top major surface to thereby selectively form a fifth semiconductor layer of the second conductivity type in a portion of the top major surface within the second and the third semiconductor layers to which the first major electrode is to be connected, the fifth semiconductor layer having a higher impurity concentration than that of any one of the second and the third semiconductor layers, the step being executed prior to the step (h).

In the device according to the first aspect of the present invention, the third semiconductor layer which is deeper than the second semiconductor layer is formed immediately below the gate wire line. This maintains the breakdown voltage of the device high. Further, since the first major electrode is electrically connected to the side diffusion region of the third semiconductor layer which is adjacent to the second semiconductor layer, most of holes which are created in the vicinity of the side diffusion region thereby developing an avalanche current pass through an inner portion of the side diffusion region and are smoothly ejected to the first major electrode. In addition, since the fourth semiconductor layer does not exist in this principal path, conduction of a parasitic bipolar transistor due to a flow of holes is suppressed. This improves an RBSOA.

In the device according to the second aspect of the present invention, the first major electrode is also connected to the margin region which is a certain region within the second semiconductor layer which is adjacent to the side diffusion region, just as the first major electrode is connected to the side diffusion region. Further, the fourth semiconductor layer does not exist in the margin region. Hence, a small number of holes which are off the principal path are also smoothly ejected to the first major electrode, and conduction of the parasitic bipolar transistor due to these small number of holes is suppressed. As a result, the RBSOA is further improved.

In the device according to the third aspect of the present invention, a width of the margin region from the side diffusion region is set approximately at 50 $\mu$m or smaller. Hence, the margin region is not set unwantedly large outside a path of holes which are created in the vicinity of the side diffusion region thereby developing an avalanche current. Further, a ratio of an effective area of the device to the entire device is ensured to a practical value.

In the device according to the fourth aspect of the present invention, since the trench is divided into a plurality of unit trenches, a large main current is obtained. Further, since the plurality of unit trenches are arranged parallel to each other and equidistant from each other, electric field in the vicinity of a bottom portion of each unit trench is uniform, which in turn prevents local concentration of electric field. Since this makes it difficult for an avalanche current to be developed at the bottom portion of each unit trench, suppression of conduction of the parasitic bipolar transistor due to an avalanche current in the side diffusion region of the third semiconductor layer further effectively contributes to an improvement in the RBSOA of the device.

In the device according to the fifth aspect of the present invention, since at least one unit trench which is located at an end of the arrangement of the unit trenches is formed within the third semiconductor layer, even if the unit trenches are displaced due to displacement of a mask pattern which is used to form the unit trenches, a distance between the side diffusion region and the unit trench which is closest to the side diffusion region does not exceed the intervals between the plurality of unit trenches. Hence, it is possible to avoid an inconvenience that electric field is concentrated at a bottom portion of the unit trench which is closest to the side diffusion region and that an avalanche current is developed at this portion, it is possible to improve the RBSOA of the device, without aligning the mask pattern at a high accuracy.

In the device according to the sixth aspect of the present invention, since the edge portion of the trench along the longitudinal direction of the trench extends into the third semiconductor layer, it is possible to avoid an inconvenience that electric field is concentrated at the edge portion and that an avalanche current is developed at this portion, and it is possible to improve the RBSOA of the device.

In the device according to the seventh aspect of the present invention, the second and the third semiconductor layers are connected to the first major electrode, through the fifth semiconductor layer having a higher impurity concentration. Hence, contact resistances, and hence, potential barriers at the connection portion where these elements are connected are low. As a result, holes intruding into the second and the third semiconductor layers easily exit to the first major electrode, which in turn increases the value of a current which can be turned off. That is, a device with a high RBSOA is realized.

In the method according to the eighth aspect of the present invention, since the fourth semiconductor layer is formed except at the third semiconductor layer at the step (c) and the first major electrode is also connected to the side diffusion region at the step (h), the device according to the first aspect is obtained. In short, only by combining known wafer processes but without particularly using a complex step or a difficult step, a device with a high RBSOA is manufactured easily at a cheap cost.

In the method according to the ninth aspect of the present invention, since the fourth semiconductor layer is formed also except at the margin region at the step (c) and the first major electrode is also connected to the margin region at the step (h), the device according to the second aspect is obtained. In short, a device with a further improved RBSOA is manufactured easily at a cheap cost.

In the method according to the tenth aspect of the present invention, since a width of the margin region form side diffusion region is set at 50 μm or smaller, the device according to the third aspect is obtained.

In the method according to the eleventh aspect of the present invention, since the trench is formed as the plurality of unit trenches which are arranged parallel to each other and equidistant from each other at the step (d), the device according to the fourth aspect is obtained. In short, a device with a still further improved RBSOA is manufactured easily at a cheap cost.

In the method according to the twelfth aspect of the present invention, since at least one unit trench is formed also in the side diffusion region at the step (d), even if positions at which the plurality of unit trenches are to be formed are somewhat displaced, a distance between the side diffusion region and the unit trench which is closest to the side diffusion region does not exceed the intervals between the plurality of unit trenches. Hence, it is possible to manufacture a device in which an avalanche current is not likely to be developed at the bottom portions of the unit trenches, i.e., a device with an excellent RBSOA, without raising the accuracy of the positions at which the plurality of unit trenches are to be formed.

In the method according to the thirteenth aspect of the present invention, since the trench is so formed that an edge portion of the trench along the longitudinal direction of the trench extends into the third semiconductor layer, the device according to the sixth aspect which has a further improved RBSOA is obtained.

In the method according to the fourteenth aspect of the present invention, since the fifth semiconductor layer is selectively formed in the connection portion between the second and the third semiconductor layers, and the first major electrode at the step (j), the device according to the sixth aspect is obtained. In short, a device with a high RBSOA is manufactured easily at a cheap cost.

Accordingly, an object of the present invention is to obtain an insulated gate semiconductor device in which conduction of a parasitic bipolar transistor due to an avalanche current is suppressed and an RBSOA is accordingly improved. Further, the present invention aims to provide a manufacturing method which is suitable to manufacture such an insulated gate semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

<1. First Preferred Embodiment>

Figure 2:
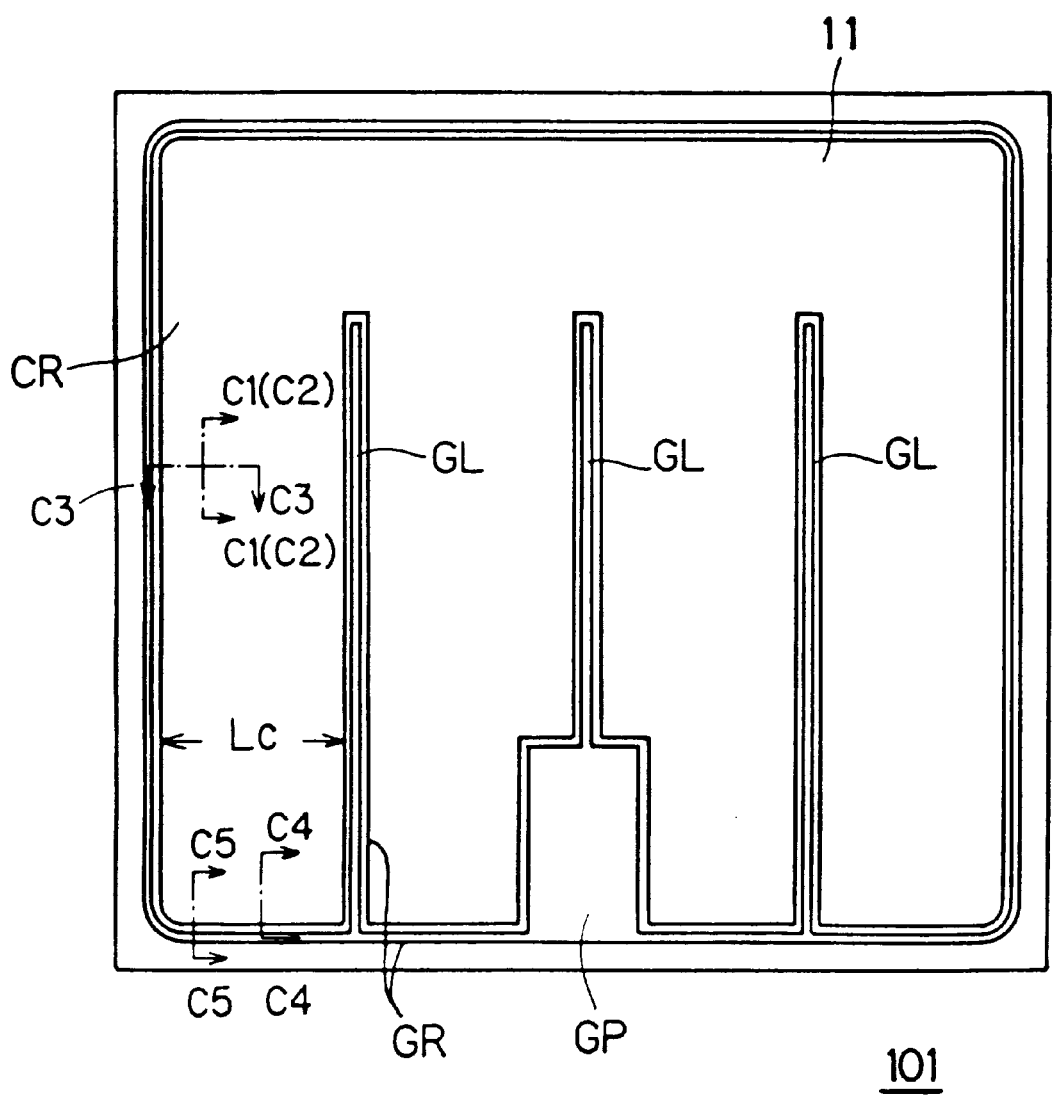
FIG. 2 is a plan view of the device according to the first preferred embodiment of the present invention.
Figure 29:
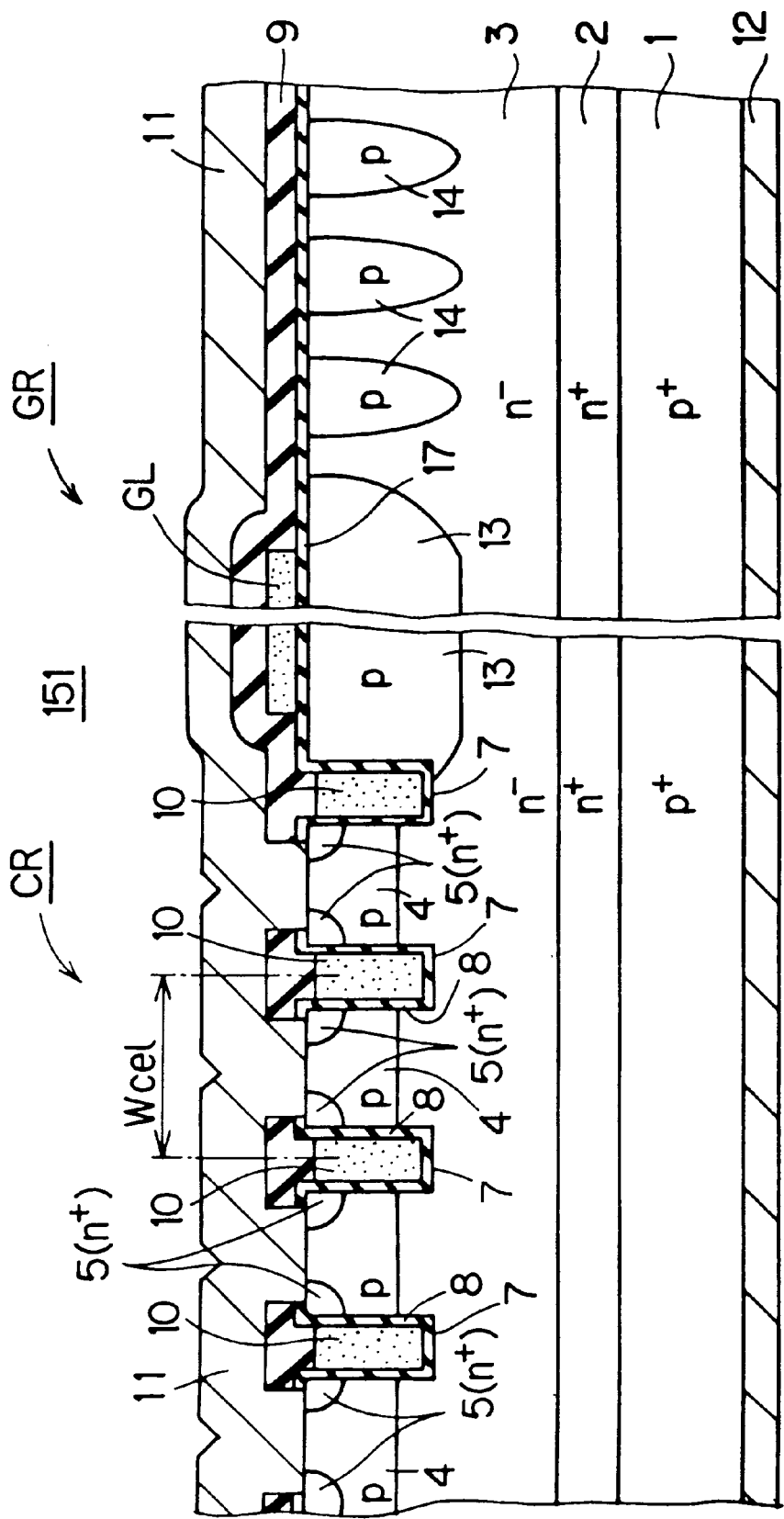
FIG. 29 is a cross sectional view showing a conventional device.
Figure 30:
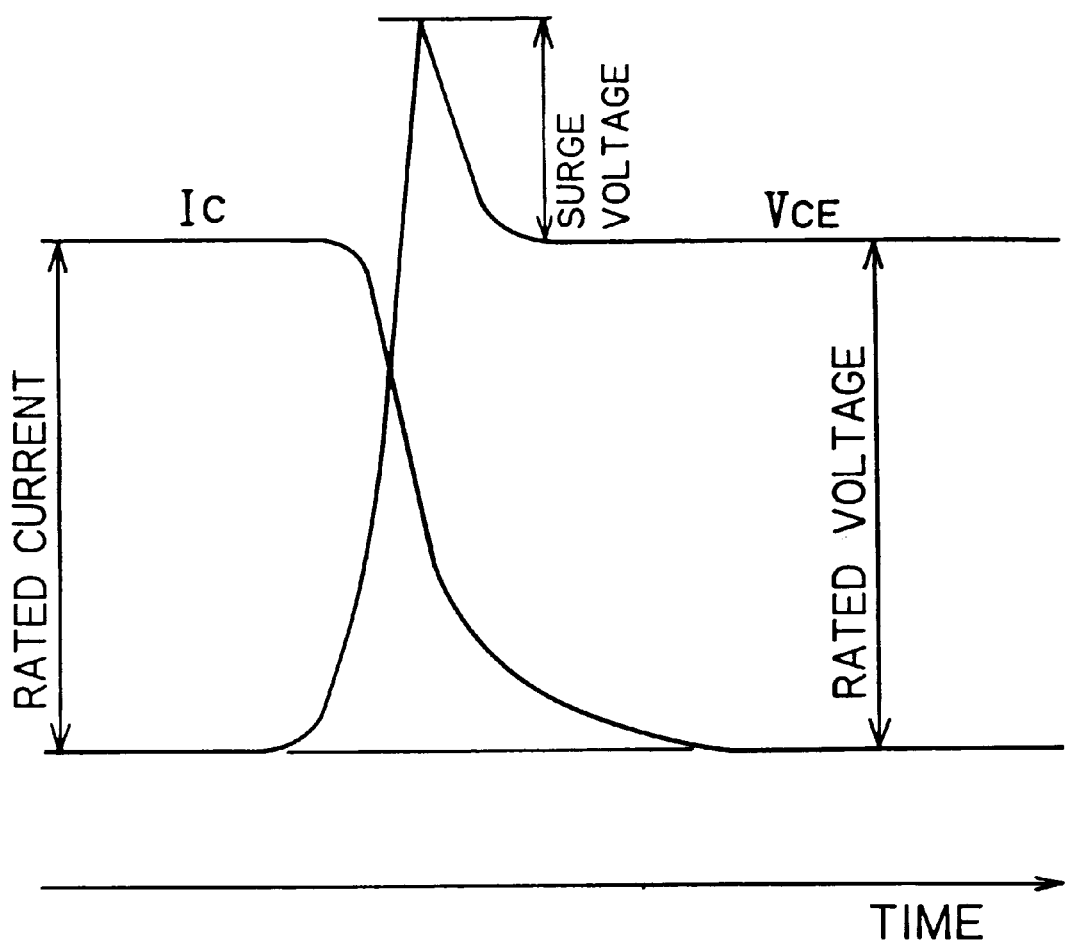
FIG. 30 is a schematic diagram for describing an operation of the conventional device.
Figure 31:
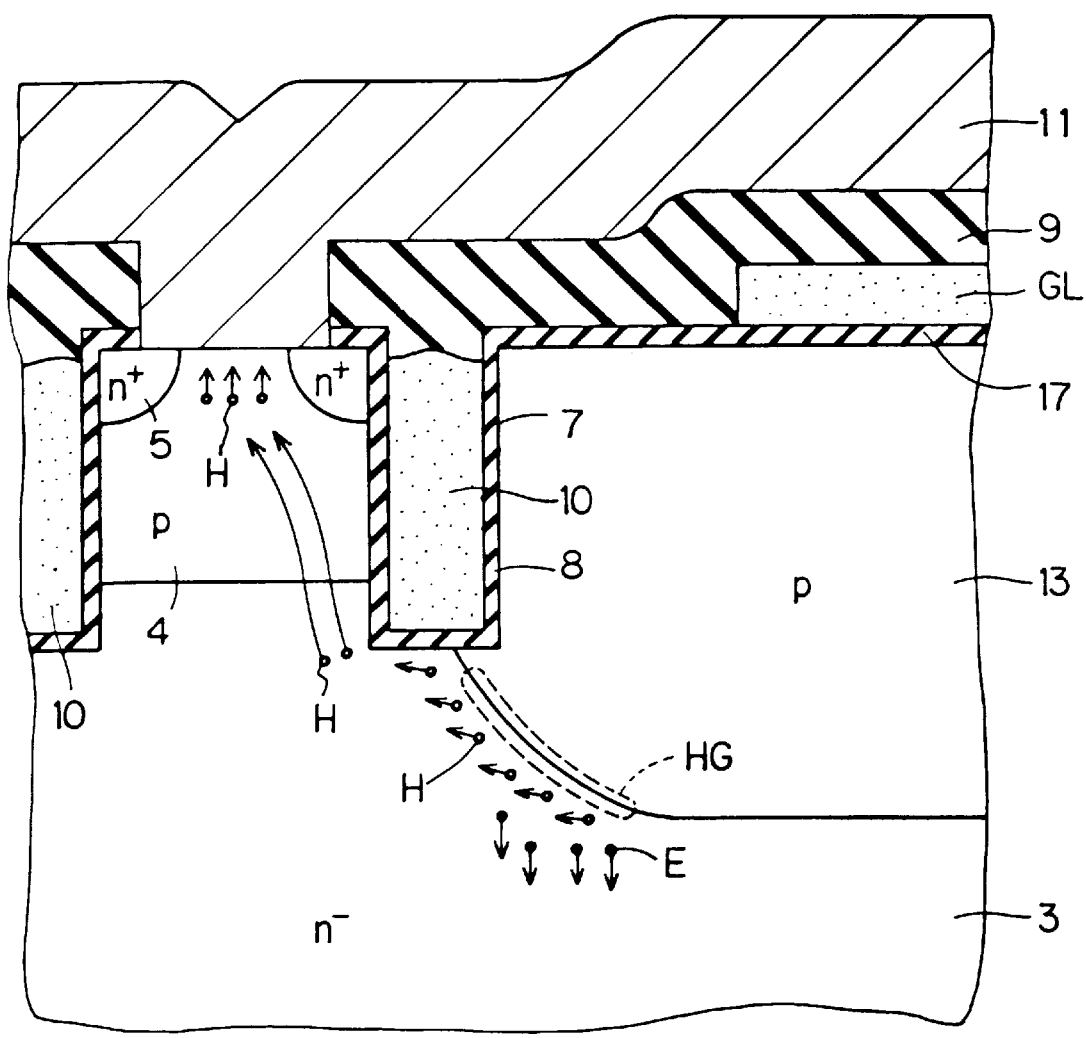
FIG. 31 is a partially expanded cross sectional view showing the conventional device.

First, an insulated gate semiconductor device according to a first preferred embodiment of the present invention will be described. FIG. 2 is a plan view of the insulated gate semiconductor device according to the first preferred embodiment. Similarly to the conventional device 151 shown in FIG. 29, this device 101 is formed as an IGBT which includes a number of unit cells. In the drawing referred to in the following, portions corresponding to those of the conventional device 151, namely, portions having the same functions will be denoted by the same reference symbols as those which are used in FIG. 29.

As shown in FIG. 2, a rectangular gate pad GP is disposed next to a central portion of one side, on a top surface of the device 101. A gate wire line GL is connected to the gate pad GP. The gate wire line GL is disposed along an outer periphery of the top surface of the device 101, and is also disposed so as to extrude from one side to the opposite side in a comb-like configuration. That is, the gate wire line GL is disposed as if to divide the top surface into equal parts. Over the entire surface which is surrounded by the gate wire line GL, an emitter electrode 11 is formed.

Although not shown in FIG. 2, below the emitter electrode 11 (i.e., in the direction of depth of FIG. 2), a number of IGBT cells which serve as unit cells are arranged in the form of stripes which are perpendicular to the comb-like shaped gate wire line GL. A region in which the unit cells are arranged will be referred to as "cell region CR." A region in which the gate wire line GL is arranged will be referred to as "gate wire region GR."

<1-1. Structure and Operation of Cell Region>

Figure 3:
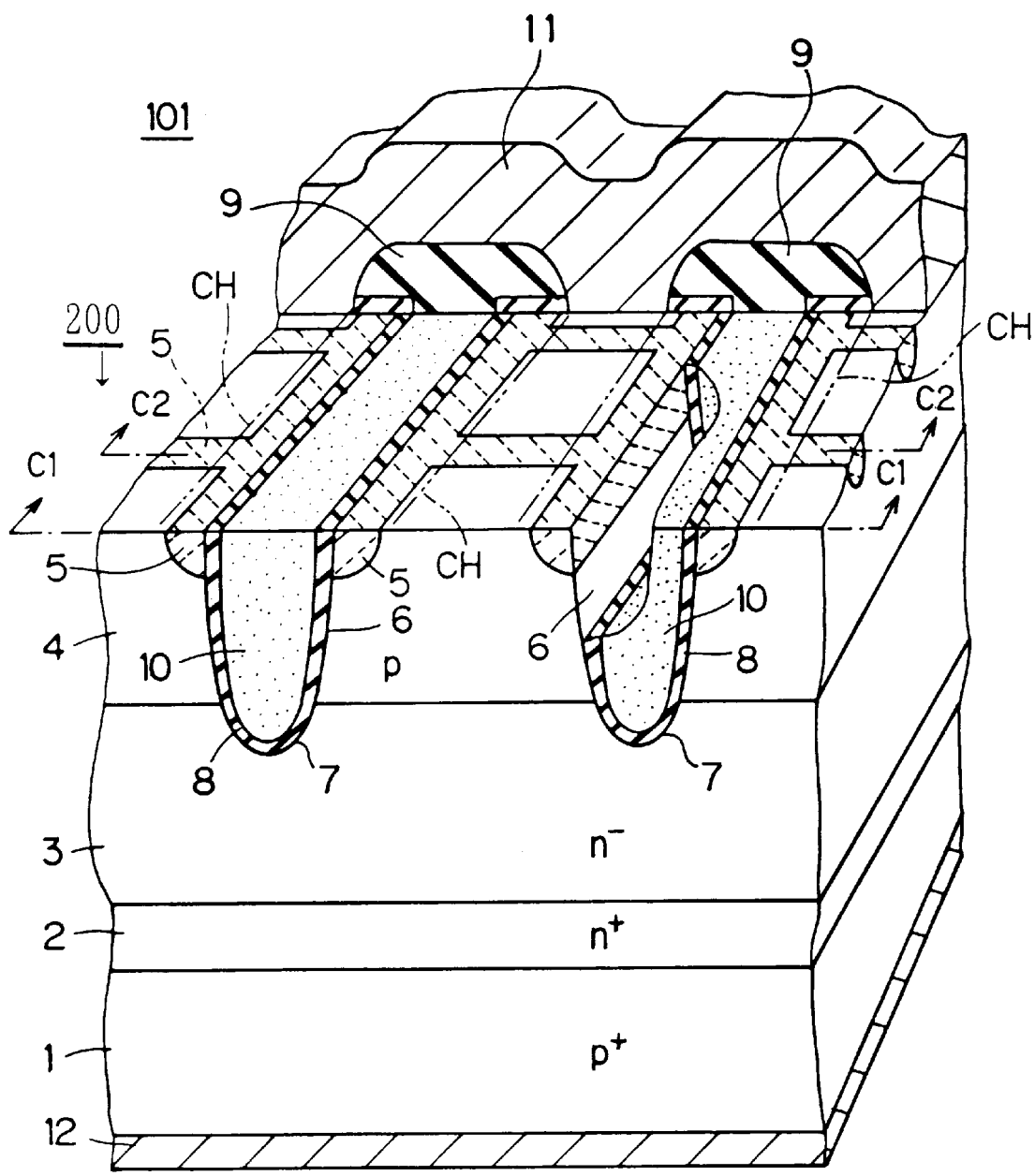
FIG. 3 is a perspective view in cross section, showing the device according to the first preferred embodiment of the present invention.

FIG. 3 is a perspective view in cross section of the device 101, taken along a cutting plane line C1—C1 (FIG. 2) within the cell region CR. In FIG. 3, two unit cells are drawn. As shown in FIG. 3, in the device 101, an n° buffer layer 2 which includes an n-type impurity of a high concentration is formed on a p$^+$ collector layer 1 which includes a p-type impurity of a high concentration, and an semiconductor layer 3 which includes an n-type impurity of a low concentration is formed on the n$^+$ buffer layer 2.

Further, a p base layer 4 is formed on the n$^-$ semiconductor layer 3, by introducing a p-type impurity. In a top major surface of the p base layer 4, by selectively introducing an n-type impurity of a high concentration, an n$^+$ emitter layer 5 is selectively formed. These five semiconductor layers form a flat-plate like semiconductor base 200 having two major surfaces.

In a top major surface of the semiconductor base 200 (i.e., a major surface in which the p base layer 4 is formed), trenches 7 are formed which penetrate the n+emitter layer 5 and the p base layer 4 and reach the n$^-$ semiconductor layer 3. Each trench 7 is formed in each unit cell, in such a manner that the trenches 7 are arranged like stripes which are parallel to each other. Gate insulation films 8 are formed on inner wall surfaces of the trenches 7, and gate electrode (i.e., trench gate) 10 is buried inside the gate insulation films 8. A stripe-like region of the p base layer 4 which is faced with the gate electrode 10 and is sandwiched between the n$^+$ emitter layer 5 and the n$^-$ semiconductor layer 3 serves as a channel region 6.

The n$^+$ emitter layer 5 is formed so as to be exposed, in a ladder-like configuration, to a top major surface of the p base layer 4 between two adjacent trenches 7. That is, the n$^+$ emitter layer 5 includes two strip-like portions which extend like stripes in contact with side walls of the two adjacent trenches 7, and a cross bar portion which partially connects the two strip-like portions (along a cutting plane line C2—C2 in FIG. 3). Hence, in a cross section taken along the cutting plane line C2—C2, the n$^+$ emitter layer 5 links the two adjacent trenches 7, along the top surface of the semiconductor base 200 (not shown).

In the top major surface of the semiconductor base 200, an insulation layer 9 is selectively formed to cover the gate electrode 10. The insulation layer 9 is coated with the emitter electrode 11. Within the insulation layer 9, at regions which are between two adjacent trenches 7, contact holes CH are formed to open in the form of stripes. Through the contact holes CH, the emitter electrode 11 is connected to both the n$^+$ emitter layer 5 and the p base layer 4.

On the other hand, in a bottom major surface of the semiconductor base 200, i.e., in a major surface where the p$^+$ collector layer 1 is exposed, a collector electrode 12 is formed. The collector electrode 12 and the emitter electrode 11 form a pair of main electrodes which functions as a path of a collector current (i.e., a main current).

In a typical example in which the semiconductor base 200 is mainly formed of silicon, the gate insulation films 8 are formed preferably by a thermal oxide film of silicon, namely, $SiO_2$. The trenches 7 and the gate wire line GL are formed preferably by polysilicon which is doped with an impurity. Further, the insulation layer 9 is formed preferably by BPSG, i.e., silicate glass which contains boron and phosphorus. In addition, the emitter electrode 11 and the gate pad GP are formed preferably by Al—Si, i.e., aluminum which contains Si. The collector electrode 12 is formed preferably by AlMoNiAu alloy.

To use this device 101, first, by connecting an external power source, a positive collector voltage $V_{CE}$ is applied across the collector electrode 12 and the emitter electrode 11. In this condition, when a positive gate voltage $V_{GE}$ exceeding a predetermined gate threshold voltage $V_{GE(th)}$ is applied across the gate electrode 10 and the emitter electrode 11, the channel region 6 of the p-type is reversed to the n-type. As result of this, electrons are injected into the n$^-$ semiconductor layer 3 from the emitter electrode 11 through the n$^+$ emitter layer 5.

As the injected electrons forwardly bias between the p$^+$ collector layer 1 and the n$^-$ semiconductor layer 3 (including the n$^+$ buffer layer 2), holes are injected into the n$^-$ semiconductor layer 3 from the p$^+$ collector layer 1. Since this greatly reduces the resistance of the n$^-$ semiconductor layer 3, a large collector current (which is a main current) flows from the collector electrode 12 to the emitter electrode 11. That is, the device turns into an ON state (i.e., turns on) between the emitter electrode 11 and the collector electrode 12.

A resistance and a voltage across the emitter electrode 11 and the collector electrode 12 in this condition are called "ON-resistance" and "ON-voltage $V_{CE(sat)}$," respectively. As described above, in the device 101, since holes are injected from the p$^+$ collector layer 1, the resistance of the n$^-$ semiconductor layer 3 is low. This realizes a low ON-resistance, i.e., a low ON-voltage $V_{CE(sat)}$.

Next, when the gate voltage $V_{GE}$ is returned to zero or a negative value (i.e., reversely biased) (that is, the gate is turned off), a channel which is created in the channel region 6 disappears so that the channel region 6 switches to the p-type which is the original conductivity type of the channel region 6. As this stops injection of electrons from the emitter electrode 11, injection of holes from the p+ collector layer 1 stops.

Following this, electrons and holes staying within the n− semiconductor layer 3 (and the n+ buffer layer 2) are collected to the collector electrode 12 and the emitter electrode 11, or re-combined with each other and disappear. As result of this, the device is brought into an OFF state (i.e., turns off) in which a current does not flow across the emitter electrode 11 and the collector electrode 12.

Since, in the device 101, the n+ emitter layer 5 is exposed in a ladder-like configuration to a region of a top major surface of the semiconductor base 200 between the trenches 7, even if the positions of the contact holes CH (which are shown in a dot-dot-slash line in FIG. 3) are displaced, electric contact of the p base layer 4 and the n+ emitter layer 5 with the emitter electrode 11 is always guaranteed. Since this does not require a redundant design which considers positional displacement of the contact holes CH, it is easy to complete the unit cells in fine patterns.

<1-2. Structure and Operation in the Vicinity of Boundary Between Cell Region and Gate Wire Region>

Figure 1:
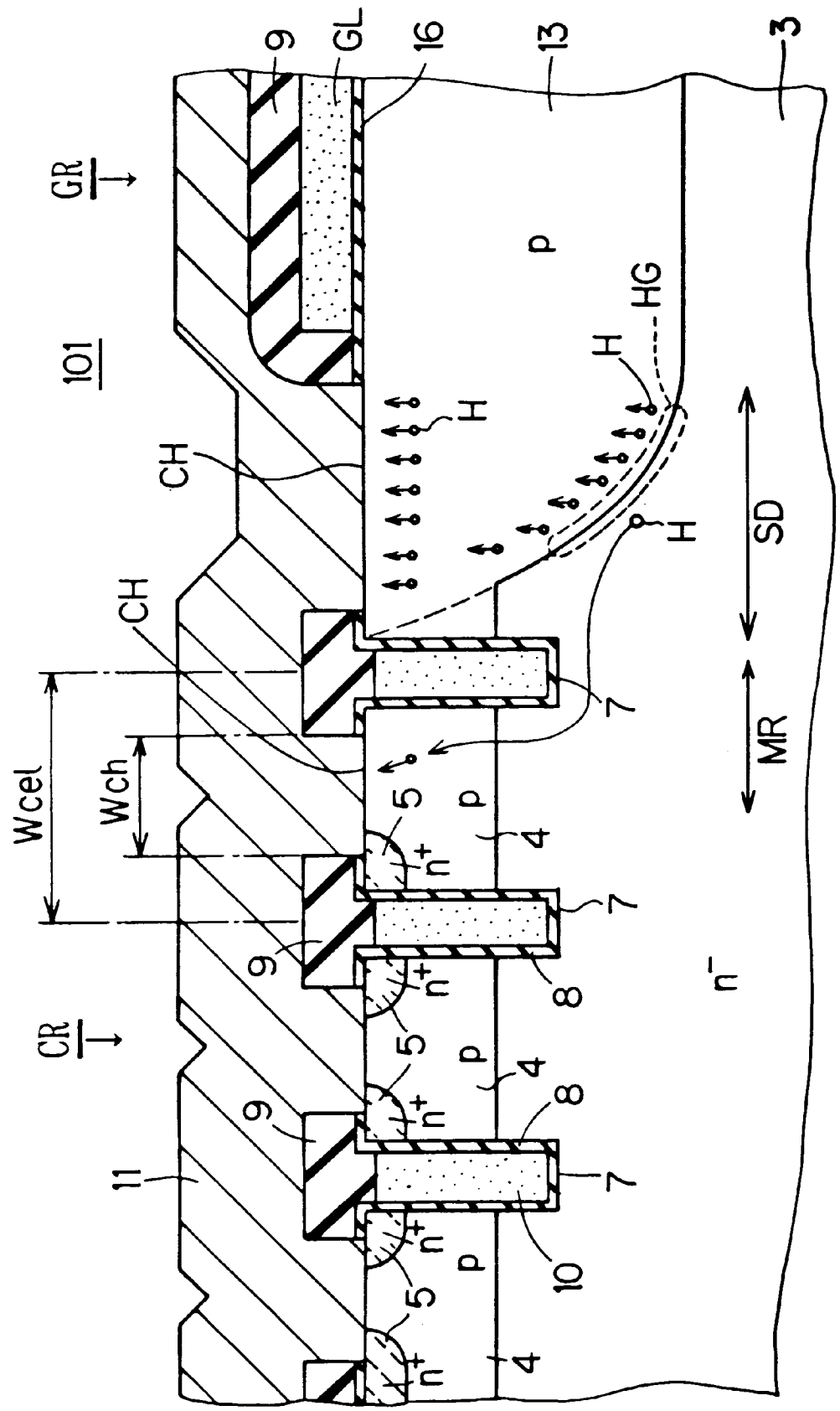
FIG. 1 is a cross sectional view of a device according to a first preferred embodiment of the present invention.
Figure 4:
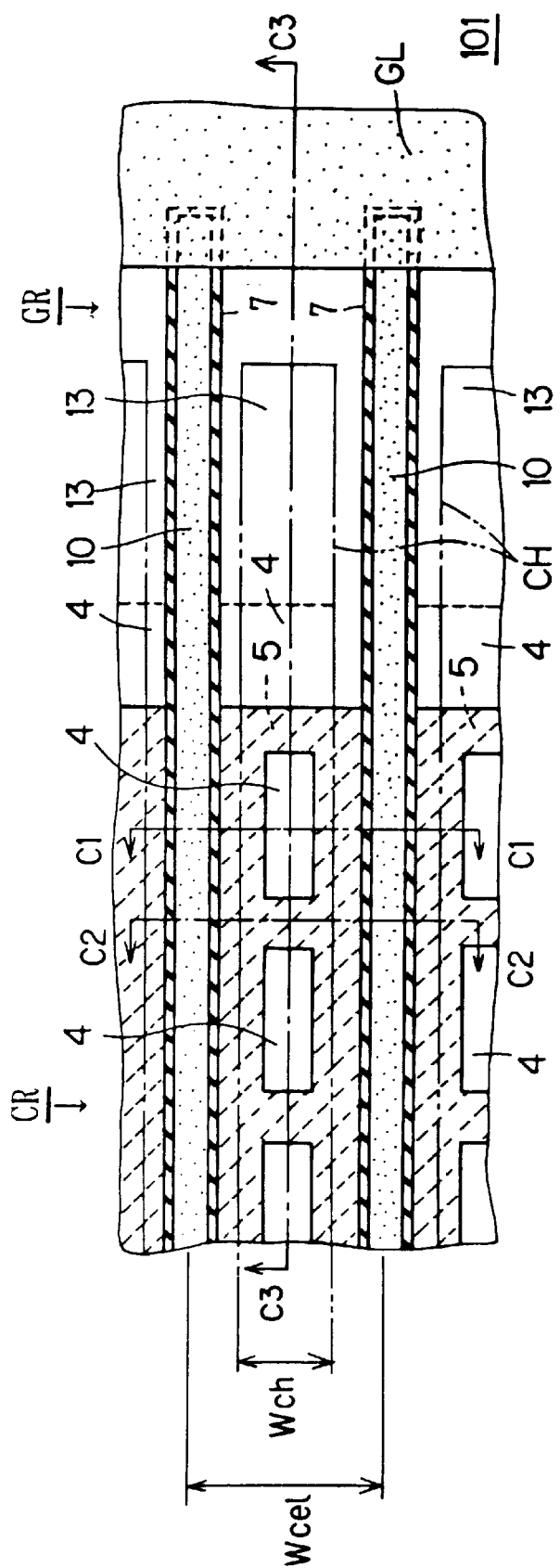
FIGS. 4 and 5 are cross sectional views of the device according to the first preferred embodiment of the present invention.
Figure 5:
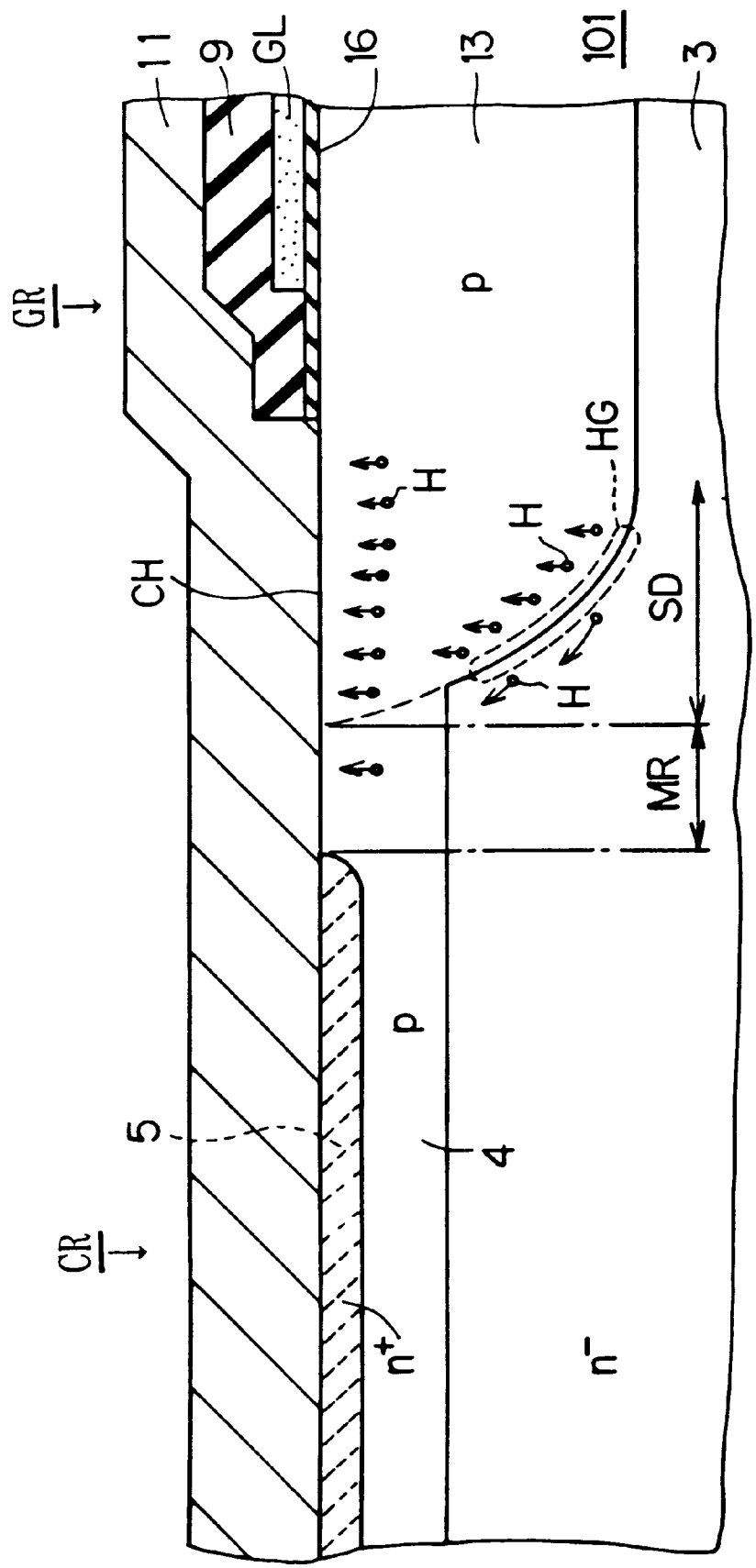

FIGS. 4, 5 and 1 are cross sectional views showing a structure in the vicinity of a boundary between the cell region CR and the gate wire region GR in the device 101. Of these cross sectional views, FIG. 4 is a cross sectional view showing the top major surface of the semiconductor base 200 taken in the vicinity of a cutting plane line C3—C3 of FIG. 2. FIG. 5 is a cross sectional view taken along the cutting plane line C3—C3. FIG. 1 is a cross sectional view taken along a cutting plane line C4—C4.

As shown in FIG. 4 or 1, in the cell region CR, the unit cells are arranged parallel to each other, with a constant distance $W_{cel}$ from each other. In the cell region CR, the contact holes CH are each formed in the form of a stripe which has a width of $W_{ch}$, for each unit cell.

On the other hand, in the gate wire region GR, the gate wire line GL is disposed on the top major surface of the semiconductor base 200, through an insulation film 16. In that portion of the top major surface of the n− semiconductor layer 3 which includes a region immediately below the gate wire line GL, a p semiconductor layer 13 is selectively formed. The p semiconductor layer 13 is formed deeper than the p base layer 4.

As shown in FIGS. 4 and 5, there is a boundary between the cell region CR and the gate wire region GR in the longitudinal direction of the unit cells. Further, as shown in FIG. 1, there is a boundary in a similar manner in the direction of the arrangement of the unit cells. That is, the cell region CR is surrounded by the gate wire region GR. The p semiconductor layer 13 which is associated with the gate wire region GR is formed so as to surround the cell region CR.

The p semiconductor layer 13 is formed by selectively diffusing a p-type impurity. Due to side diffusion (i.e., diffusion in a lateral direction), the cross sectional configuration of an edge portion of the p semiconductor layer 13 is warped in the shape of an arc. Hence, the edge portion of the p semiconductor layer 13 which is formed by side diffusion, namely, a side diffusion region SD is adjacent to the cell region CR.

As shown in FIG. 1, the contact hole CH is formed on a top surface (i.e., a surface which is included in the top major surface of the semiconductor base 200) of the side diffusion region SD which is located at an edge portion of the arrangement of the unit cells. Further, on the top surface of the p base layer 4 as well which is adjacent to the side diffusion region SD, the contact hole CH is formed on a margin region MR which is a region within a certain distance from the side diffusion region SD.

As shown in FIGS. 4 and 5, since the gate electrode 10 is connected to the gate wire line GL at the edge portion of the unit cells in the longitudinal direction, the trenches 7 penetrate the p semiconductor layer 13. The contact holes CH which are formed between adjacent trenches 7 extend over from a top surface of the margin region MR which is adjacent to the p semiconductor layer 13 to the top surface of the side diffusion region SD.

In this manner, the contact holes CH are formed in the top surface of the side diffusion region SD which surrounds the cell region CR and in the top surface of the margin region MR which is adjacent to the side diffusion region SD. Through the contact holes CH, the top surface of the side diffusion region SD and the top surface of the p base layer 4 which corresponds to the margin region MR are connected to the emitter electrode 11. Further, the n+ emitter layer 5 are not formed in the side diffusion region SD and the margin region MR.

These characteristic structures within the side diffusion region SD and the margin region MR play an important role in relation to the RBSOA of the device 101. For instance, during transition of the device 101 from the ON-state to the OFF-state with the L load connected, as shown in FIGS. 1 and 5, in the vicinity of a warped interface between the side diffusion region SD and the n− semiconductor layer 3, pairs of holes H and electrons E are created. Of these, the electrons E flow toward the collector electrode 12 while the holes H flow toward the emitter electrode 11. These carriers develop an avalanche current.

However, unlike in the conventional device 151, since the top surface of the side diffusion region SD is connected to the emitter electrode 11 through the contact holes CH, most of the created holes H smoothly pass through the side diffusion region SD toward the emitter electrode 11 which is connected to the top surface of the side diffusion region SD. In other words, a path passing through the side diffusion region SD toward the emitter electrode 11 which is connected to the top surface of the side diffusion region SD is a principal path of the holes H.

Meanwhile, a small number of holes H which are off the principal path intrude into a region which is near the p semiconductor layer 13 of the p base layer 4. However, since the top surface of the margin region MR which is adjacent to the p semiconductor layer 13 is also connected to the emitter electrode 11 through the contact holes CH, these small number of holes H intruding into the p base layer 4 smoothly exit into the emitter electrode 11.

Further, as described above, neither the side diffusion region SD nor the margin region MR includes the n+ emitter layer 5. That is, the n+ emitter layer 5 does not exist in the path of the holes H. Hence, the holes H which pass through the side diffusion region SD and the margin region MR do not conduct the parasitic bipolar transistor. In other words, the RBSOA of the device is improved. As a result, during transition of the device 101 from the ON-state to the OFF-state with the L load connected, for example, the device is unlikely to get destroyed.

The width of the margin region MR may be about 50 μm, which is sufficient. The path of holes H intruding into the p base layer 4 remains within a range 50 μm from the interface of the side diffusion region SD. Hence, if the width is about 50 μm, the margin region MR can cover the path of almost all of holes H. In addition, setting the width of the margin region MR unwantedly larger exceeding 50 μm is not desirable since such leads to reduction of the effective area of the device 101.

In FIG. 2, the length of the unit cell, i.e., the cell length Lc is set typically around 1 to 2 mm. Hence, if the width of the margin region MR exceeds 50 μm, at the both ends of the unit cells, a void area exceeding 100 μm in total is created. That is, the effective area is reduced by 5 to 10% or more. The resulting reduced area is practically a tolerable limit. In this manner, to set the effective area of the device 101 in a practical range, the upper limit of the width of the margin region MR is preferably about 50 μm.

Further, as the width of the margin region MR is larger in a range from 0 to 50 μm, the ratio at which the width covers holes H which are off the principal path becomes larger, and hence, the effect of suppressing conduction of the parasitic bipolar transistor becomes larger. It is to be noted, however, that even if the width of the margin region MR is 0, i.e., when there is no margin region MR, since the principal path of the holes H exists within the side diffusion region SD, the effect of suppressing conduction of the parasitic bipolar transistor is created to a reasonable extent.

As described earlier, in the device 101, a plurality of the trenches 7 are arranged parallel to each other, with the constant distance $W_{cel}$ from each other. This prevents concentration of electric field at the bottom portions of some of the trenches 7. Further, the distance $W_{cel}$ is set sufficiently narrow (e.g., 3 to 5 μm) to weaken electric field in the vicinity of the bottom portion of each trench 7. In addition, as not shown in the drawing, a guard ring is disposed around the gate wire line GL which is disposed along the outer periphery of the top major surface of the semiconductor base 200, as in the conventional device 151.

Hence, an avalanche current is developed only in the region which is shown in FIGS. 1 and 5, i.e., the region in the vicinity of the boundary between the side diffusion region SD and the n⁻ semiconductor layer 3, facing the cell region CR. The avalanche current which is developed in this region does not conduct the parasitic bipolar transistor, and therefore, conduction of the parasitic bipolar transistor is suppressed in the device 101 as a whole. That is, the characteristic structures within the side diffusion region SD and the margin region MR effectively lead to an improvement in the RBSOA of the device 101.

In addition, as described above, the structure in which the n⁺ emitter layer 5 is exposed in a ladder-like configuration to the top major surface of the semiconductor base 200 contributes to creation of the unit cells in fine patterns. That is, it is possible to set the distance $W_{cel}$ further narrow. This further prevents development of an avalanche current at portions other than the side diffusion region SD, and therefore, further effectively improves the RBSOA of the device 101.

<1-3. Manufacturing Method>

Figure 6:
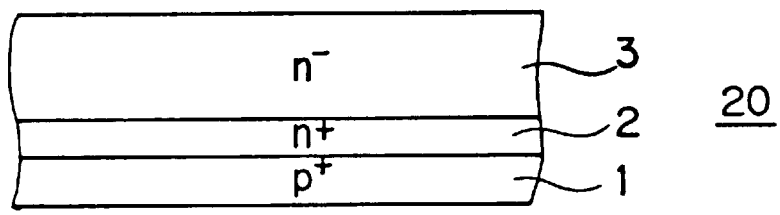
FIGS. 6 to 17 are views showing steps of manufacturing the device according to the first preferred embodiment of the present invention.

Now, a manufacturing method of the device 101 will be described. FIGS. 6 to 17 are views showing steps of a preferable manufacturing method of manufacturing the device 101. To manufacture the device 101, first, as shown in FIG. 6, a flat-plate like semiconductor base 20 is formed which serves as a basis of the semiconductor base 200.

The semiconductor base 20 is obtained by preparing a p-type silicon substrate which corresponds to the p⁺ collector layer 1, and thereafter epitaxially growing the n⁺ buffer layer 2 and the n⁻ semiconductor layer 3 sequentially in this order as a stacked structure on one major surface of the p-type silicon substrate, for instance. The n⁺ buffer layer 2 and the n⁻ semiconductor layer 3 which have different impurity concentrations from each other are obtained by changing the quantity of an impurity stepwise which is introduced during epitaxial growth.

Figure 7:
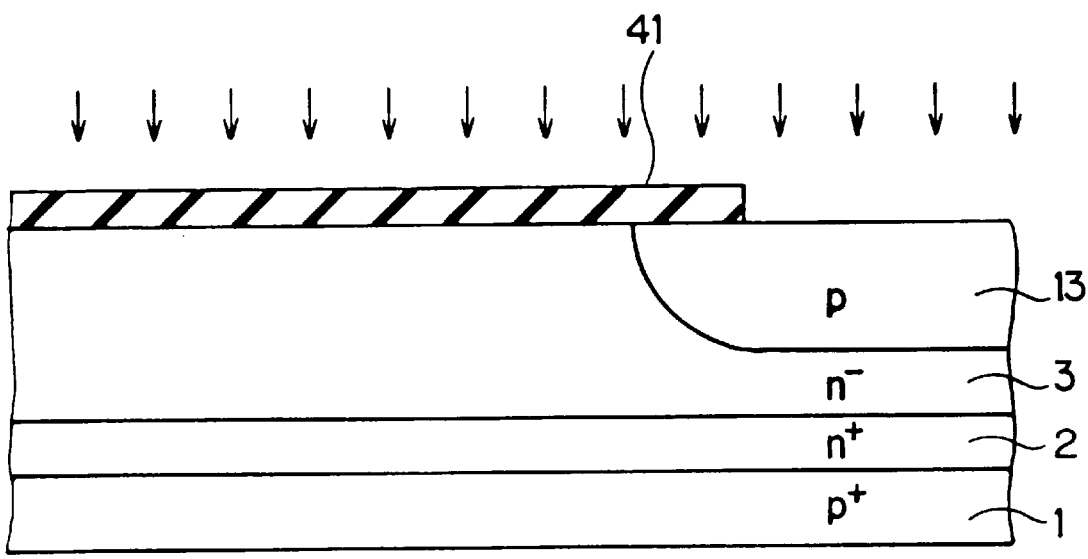

Next, as shown in FIG. 7, a shielding element 41 whose pattern configuration corresponds to the p semiconductor layer 13 which is to be formed is formed on the n⁻ semiconductor layer 3. Using the shielding element 41 as a mask, a p-type impurity is selectively implanted and then diffused by annealing. As a result, the p semiconductor layer 13 is selectively formed on the top surface of the n⁻ semiconductor layer 3.

Figure 8:
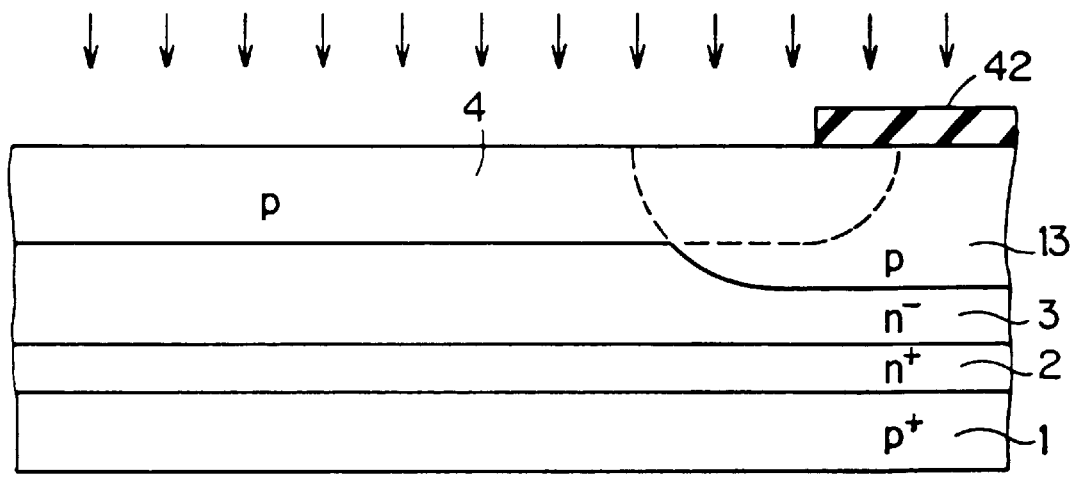

Next, as shown in FIG. 8, a shielding element 42 whose pattern configuration corresponds to the p base layer 4 which is to be formed is formed on the semiconductor layer 3. Using the shielding element 42 as a mask, a p-type impurity is selectively implanted. After removing the shielding element 42, the p-type impurity is diffused by annealing. As a result, the p base layer 4 is selectively formed on the top surface of the n⁻ semiconductor layer 3. The p base layer 4 is formed so as to be continuous to the p semiconductor layer 13, but to be shallower than the p semiconductor layer 13.

Figure 9:
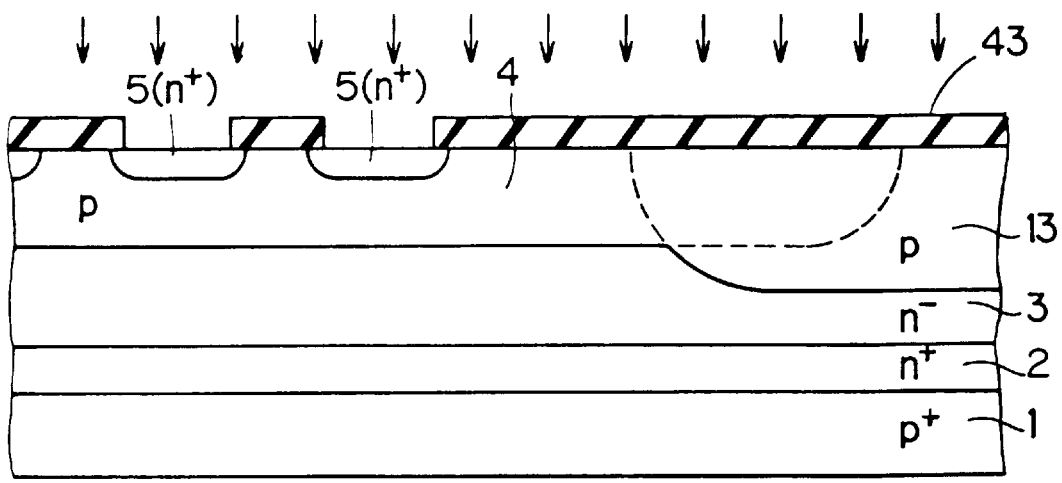

Next, as shown in FIG. 9, a shielding element 43 is formed which has an opening portion corresponding to the n⁺ emitter layer 5 on the p base layer 4. The pattern configuration of the shielding element 43 is easily obtained by a known transfer technique utilizing lithography. Using the shielding element 43 as a mask, an n-type impurity is selectively implanted.

After removing the shielding element 43, the n-type impurity is diffused by annealing. As a result, the n⁺ emitter layer 5 is selectively formed on the top surface of the p base layer 4. The n⁺ emitter layer 5 is formed only in a region which is separated from the side diffusion region of the p semiconductor layer 13 by a certain distance.

Figure 10:
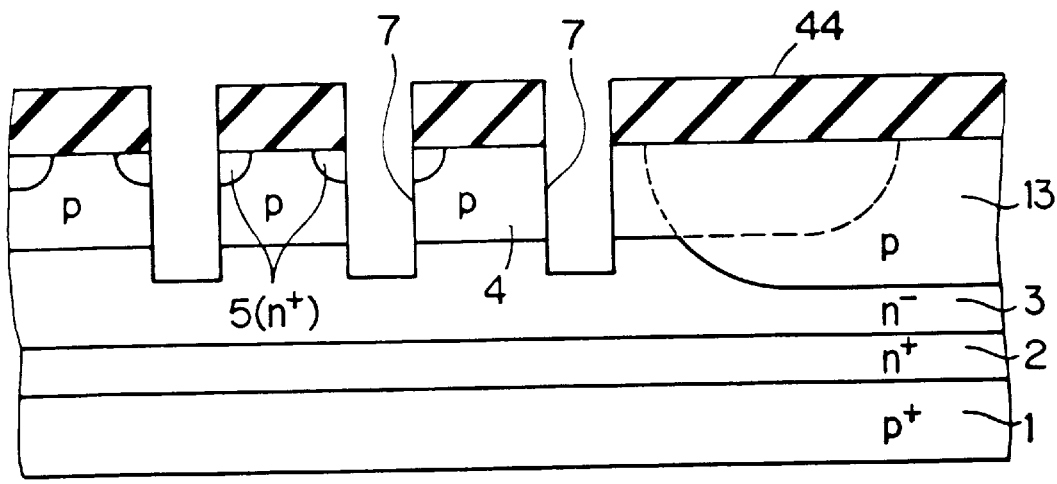

Next, as shown in FIG. 10, an oxide film (SiO₂) is formed over the entire top major surface of the semiconductor base 20 and patterned, thereby obtaining a shielding element 44. The shielding element 44 is patterned so as to selectively open at the top surface of the n⁺ emitter layer 5. In addition, as shown in FIG. 10, some of a plurality of opening portions of the shielding element 44 may be within regions which are close to the side diffusion region where there is no n⁺ emitter layer 5 created. By performing RIE (Reactive Ion Etching) using the shielding element 44 as a mask, the trenches 7 are formed which penetrate the p base layer 4 from the top surface of the semiconductor base 20 and reach the n⁺ semiconductor layer 3. The shielding element 44 is thereafter removed.

Figure 11:
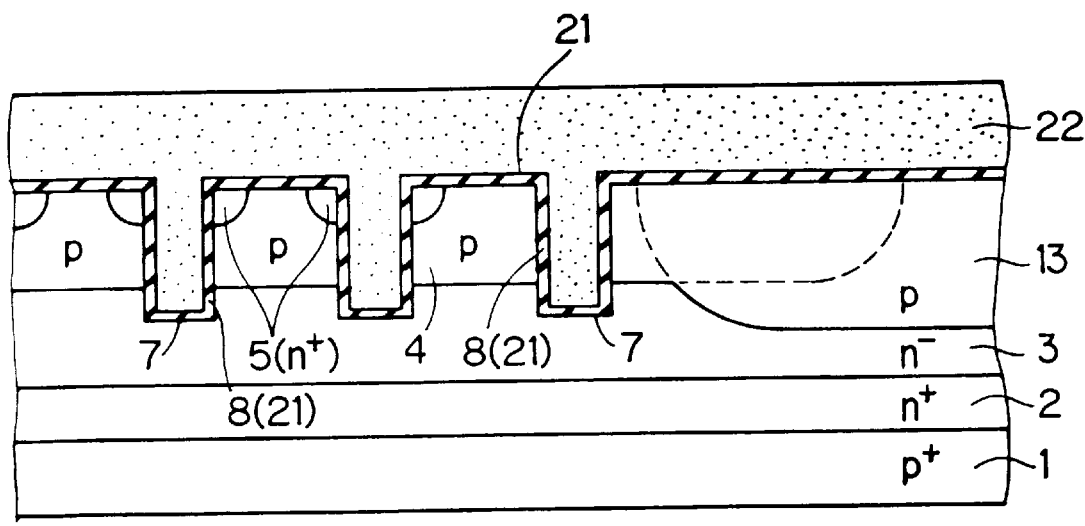

Next, as shown in FIG. 11, an oxide film 21 is formed by thermal oxidation, in a surface of the semiconductor base 20 which includes the trenches 7. Following this, polysilicon 22 doped with an impurity, for instance, is deposited on a surface of the oxide film 21. As a result, the polysilicon 22 fills up the trenches 7 and is deposited like a layer over the entire top major surface of the semiconductor base 20.

Figure 12:
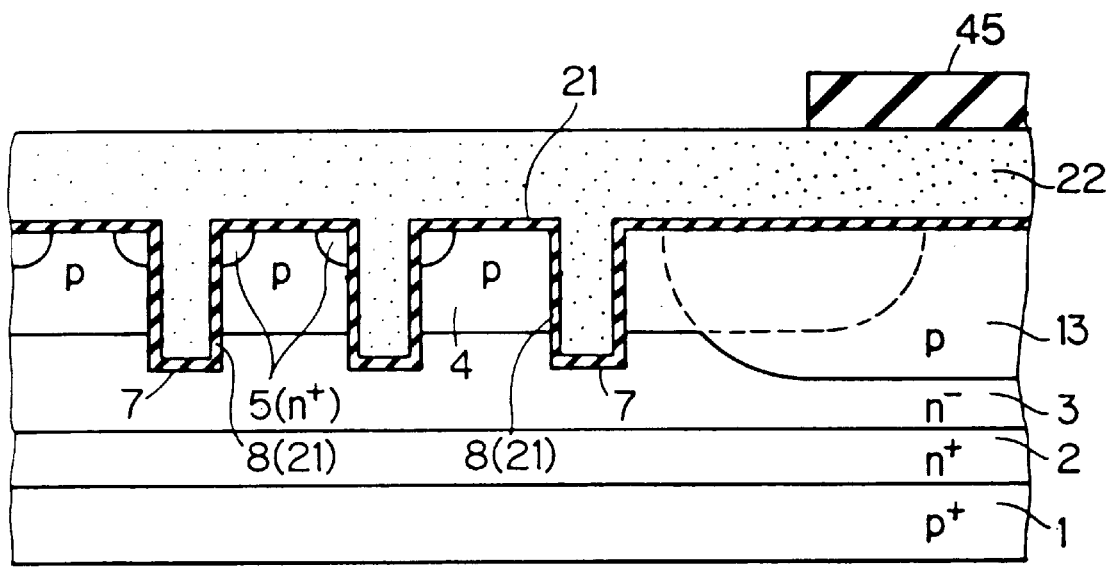

Next, as shown in FIG. 12, a shielding element 45 is selectively formed in a region of the top surface of the p semiconductor layer 13 where the gate wire line GL is to be disposed.

Figure 13:
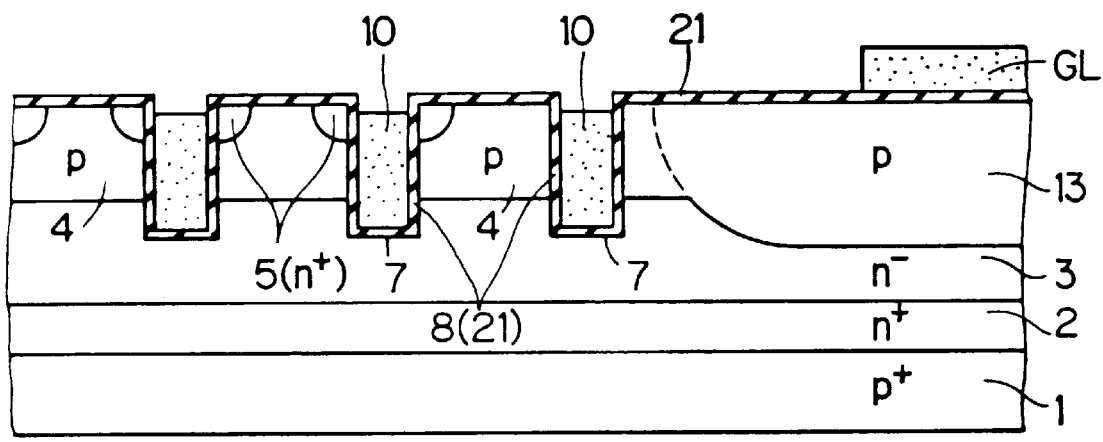

Following this, as shown in FIG. 13, using the shielding element 45 as a mask, the polysilicon 22 is selectively removed. As a result, the polysilicon 22 is removed, except at a portion which is covered by the shielding element 45 and a portion which is buried in the trenches 7. The portion which is covered by the shielding element 45 becomes the gate wire line GL, while the a portion which is buried in the trenches 7 becomes the gate electrode 10.

Figure 14:
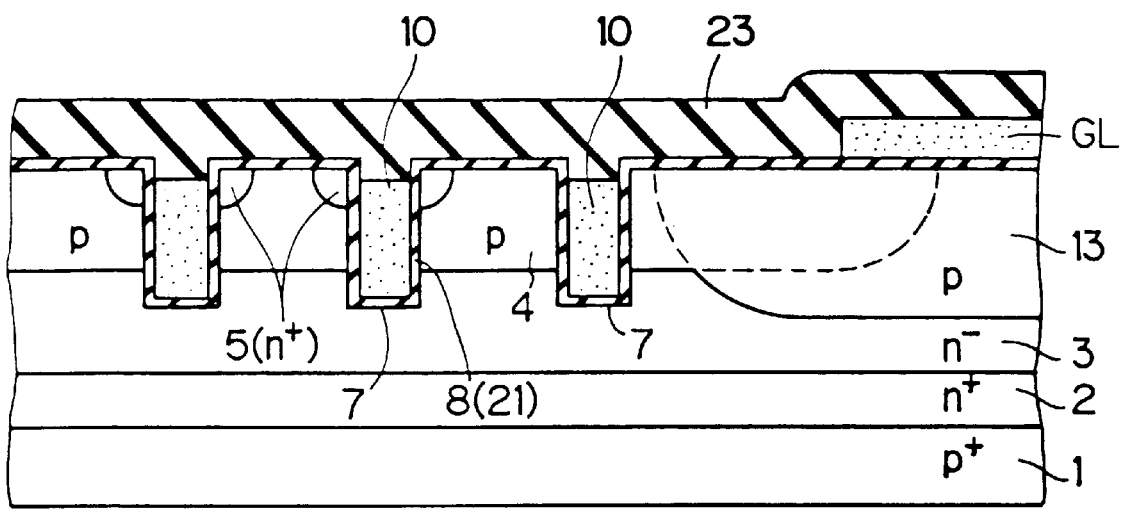

Next, as shown in FIG. 14, an insulation layer 23 is deposited to cover the entire top surface including the gate electrode 10 and the gate wire line GL. The insulation layer 23 is a basis of the insulation layer 9, and therefore, is formed by the same material as the insulation layer 9.

Figure 15:
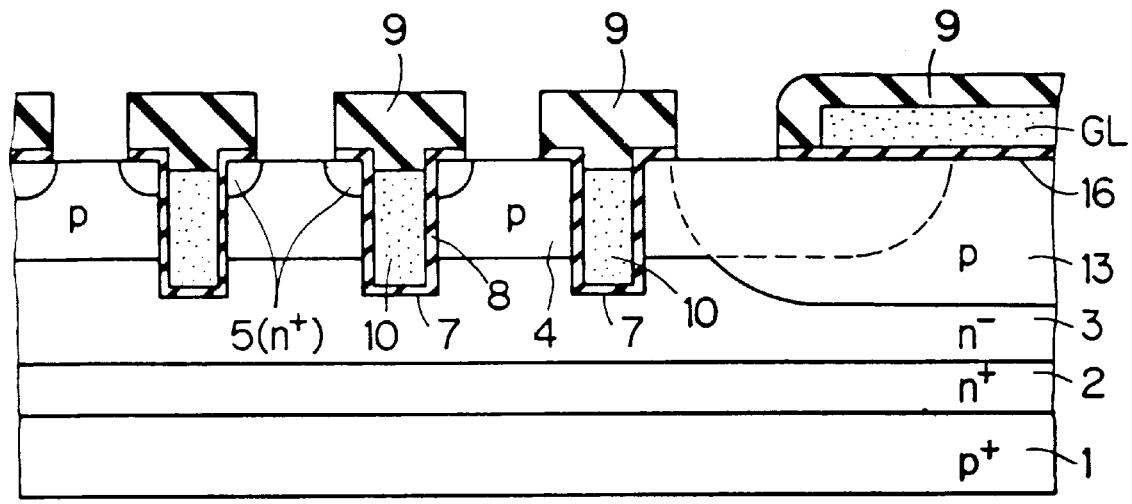

Next, as shown in FIG. 15, the insulation layer 23 is selectively removed, leaving a portion on the gate electrode 10 and a portion on the gate wire line GL, whereby the insulation layer 9 is formed. As a result, contact holes are created on the top surface at regions which are between adjacent trenches 7, on the top surface of the side diffusion region of the p semiconductor layer 13 and on the top surface at a region within the p base layer 4 which is close to the side diffusion region of the p semiconductor layer 13.

Figure 16:
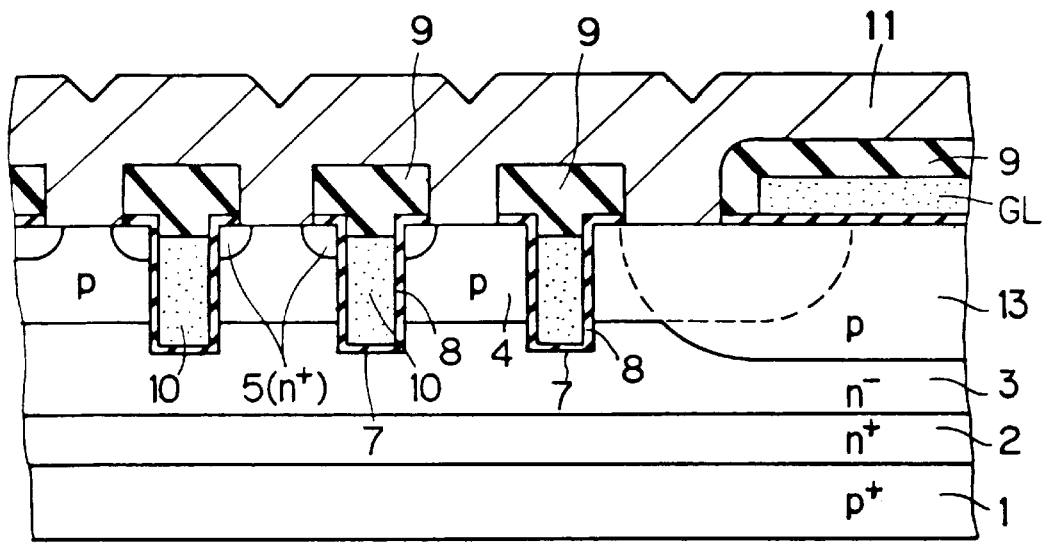

Next, as shown in FIG. 16, the emitter electrode 11 is formed by depositing Al—Si, for instance, to cover the exposed surface of the semiconductor base 20 and the top surface of the insulation layer 9. As a result, the emitter electrode 11 is selectively formed in the top surface of the semiconductor base 20, through the contact holes of the insulation layer 9.

Figure 17:
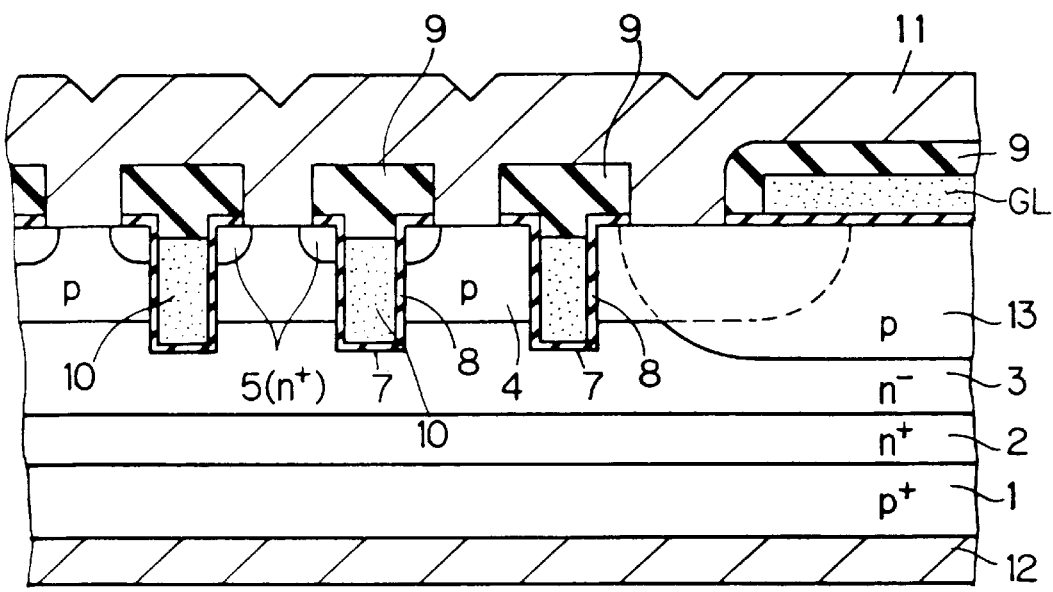

Next, as shown in FIG. 17, the collector electrode 12 is formed by depositing AlMoNiAu alloy, for instance, on a bottom major surface of the semiconductor base 20, namely, the exposed surface of the $p^+$ collector layer 1.

As described above, the device 101 is manufactured easily by combining common wafer processes which mainly perform deposition, impurity implantation and diffusion.

<2. Second Preferred Embodiment>

Figure 18:
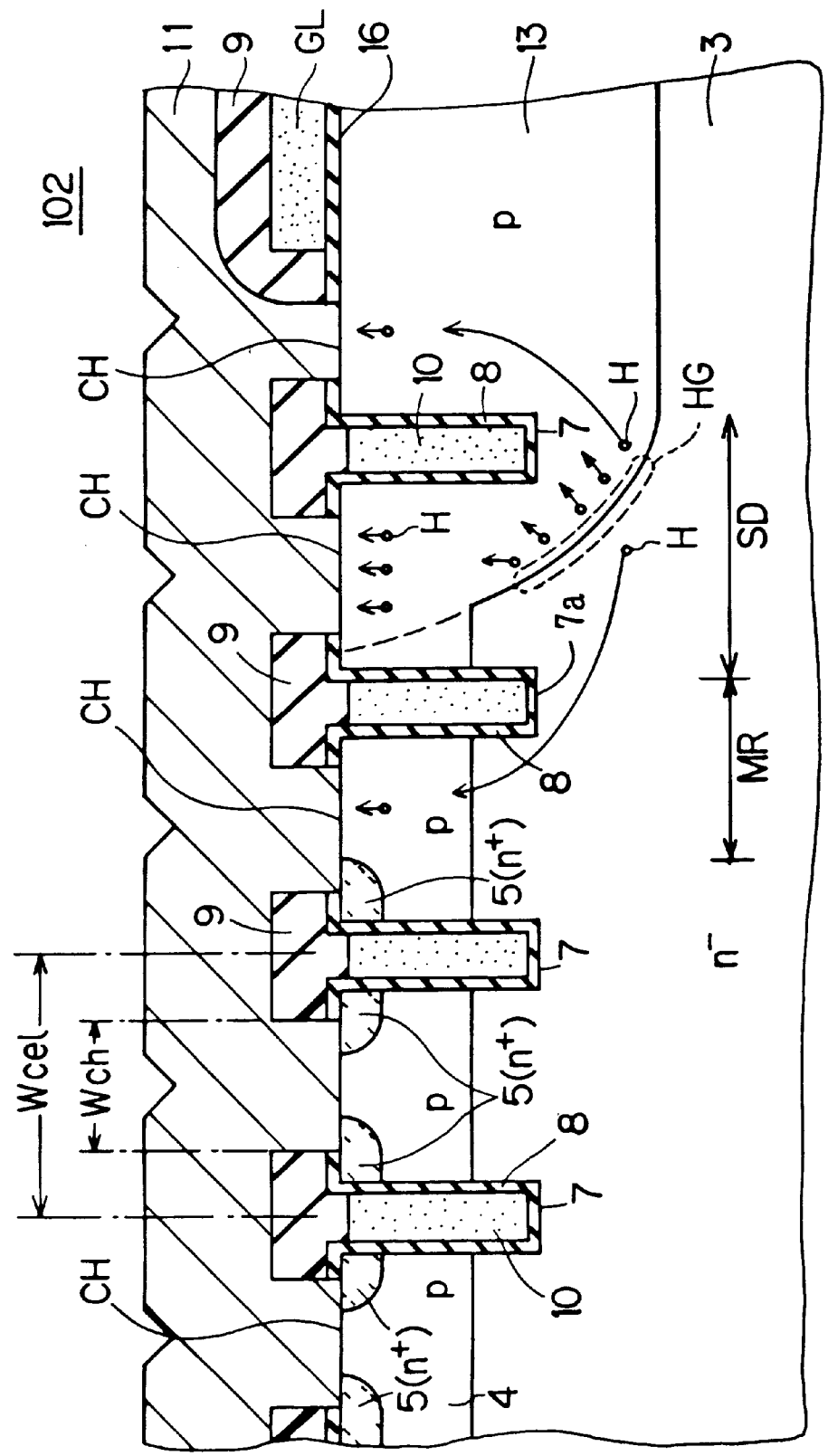
FIG. 18 is a cross sectional view of a device according to a second preferred embodiment of the present invention.

FIG. 18 is a cross sectional view of a device according to a second preferred embodiment of the present invention. A top surface of this device 102 is expressed by the plan view in FIG. 2, which is the same as the device 101. FIG. 18 corresponds to a cross section taken along the cutting plane line C4—C4 of FIG. 2.

As shown in FIG. 18, the trenches 7 are formed in the p semiconductor layer 13 as well in the device 102, which is a characteristic difference from the device 101. That is, of a plurality of the trenches 7 which are arranged parallel to each other with the constant distance $W_{cel}$ from each other, some trenches 7 which are located at edge portions in the direction of the arrangement of the trenches 7 are formed even into the p semiconductor layer 13. Although FIG. 18 shows an example where one trench 7 is formed in the p semiconductor layer 13, in general, a plurality of the trenches 7 may be formed in the p semiconductor layer 13.

The contact holes CH are formed on the top surfaces of the side diffusion region SD and the margin region MR, and the $n^+$ emitter layer 5 is not formed either in the side diffusion region SD nor the margin region MR, which is the same as in the device 101. This suppresses conduction of the parasitic bipolar transistor and improves the RBSOA of the device, as in the device 101.

At the same time, since some of the arrangement of the trenches 7 are formed to overlap the p semiconductor layer 13, even if the trenches 7 are displaced due to displacement of a mask pattern which is used to form the trenches 7, a distance between a trench 7a which is outside but closest to the side diffusion region SD and the side diffusion region SD does not exceed the distance $W_{cel}$. In short, without aligning the mask pattern at a high accuracy, it is easy to avoid an inconvenience that electric field is concentrated at a bottom portion of the trench 7a and that an avalanche current is developed at this bottom portion due to an unnecessary long distance between the side diffusion region SD and the trench 7a.

Thus, in the device 102, the RBSOA of the device is effectively improved without aligning a mask pattern at a high accuracy.

Figure 19:
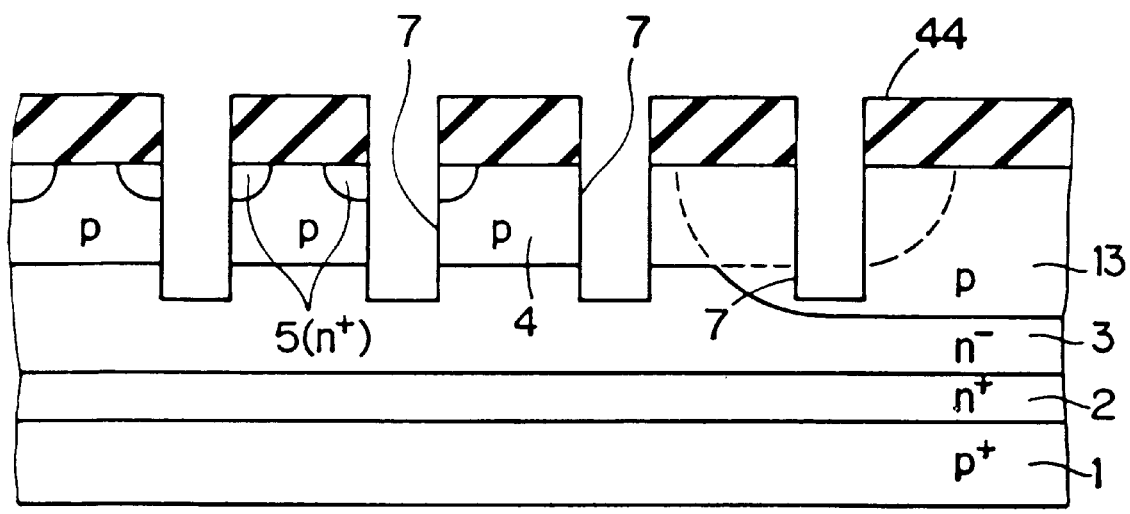
FIG. 19 is a view showing a step of manufacturing the device according to the second preferred embodiment of the present invention.

Now, a manufacturing method of the device 102 will be described. FIG. 19 is a view showing a step of manufacturing the device 102. To manufacture the device 102, the steps shown in FIGS. 6 to 9 are executed, first, Next, as shown in FIG. 19, an oxide film ($SiO_2$) is formed over the entire top major surface of the semiconductor base 20 and patterned, thereby obtaining a shielding element 44. The shielding element 44 is patterned so as to selectively open at the top surface of the $n^+$ emitter layer 5. In addition, as shown in FIG. 10, some of a plurality of opening portions of the shielding element 44 are open at the top surface of the p semiconductor layer 13.

By performing RIE while using the shielding element 44 as a mask, the trenches 7 are formed which penetrate the p base layer 4 from the top surface of the semiconductor base 20 and reach the $n^-$ semiconductor layer 3. The shielding element 44 is thereafter removed. Following this, the steps shown in FIGS. 11 to 17 are executed, whereby the device 102 is completed.

As described above, as in the manufacturing method of the device 101, the device 102 is manufactured easily by combining common wafer processes which mainly perform deposition, impurity implantation and diffusion.

<3. Third Preferred Embodiment>

Figure 20:
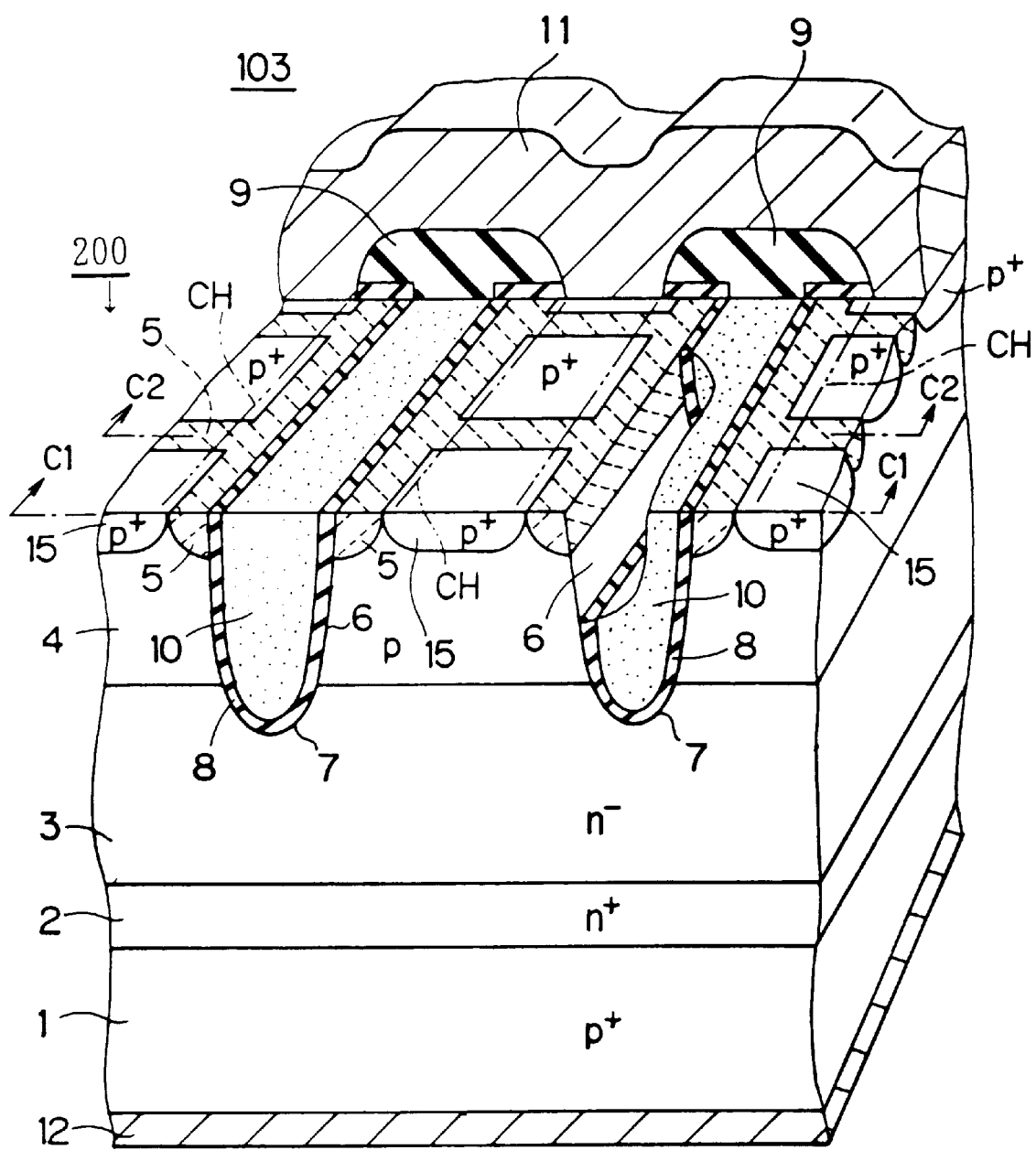
FIG. 20 is a perspective view in cross section, showing a device according to a third preferred embodiment of the present invention.

FIG. 20 is a perspective view in cross section, showing a device according to a third preferred embodiment of the present invention. A top surface of this device 103 is expressed by the plan view in FIG. 2, which is the same as the devices 101 and 102. The cross section in FIG. 20 corresponds to a cross section taken along the cutting plane line C1—C1 of FIG. 2.

As shown in FIG. 20, in the device 103, a $p^+$ layer 15 which is more heavily doped with a p-type impurity than the p base layer 4 is formed in the exposed surface of the p base layer 4 which is surrounded by the $n^+$ emitter layer 5 within the top major surface of the semiconductor base 200. This is a characteristic difference from the structure of the device 101 which is shown in FIG. 3.

Figure 21:
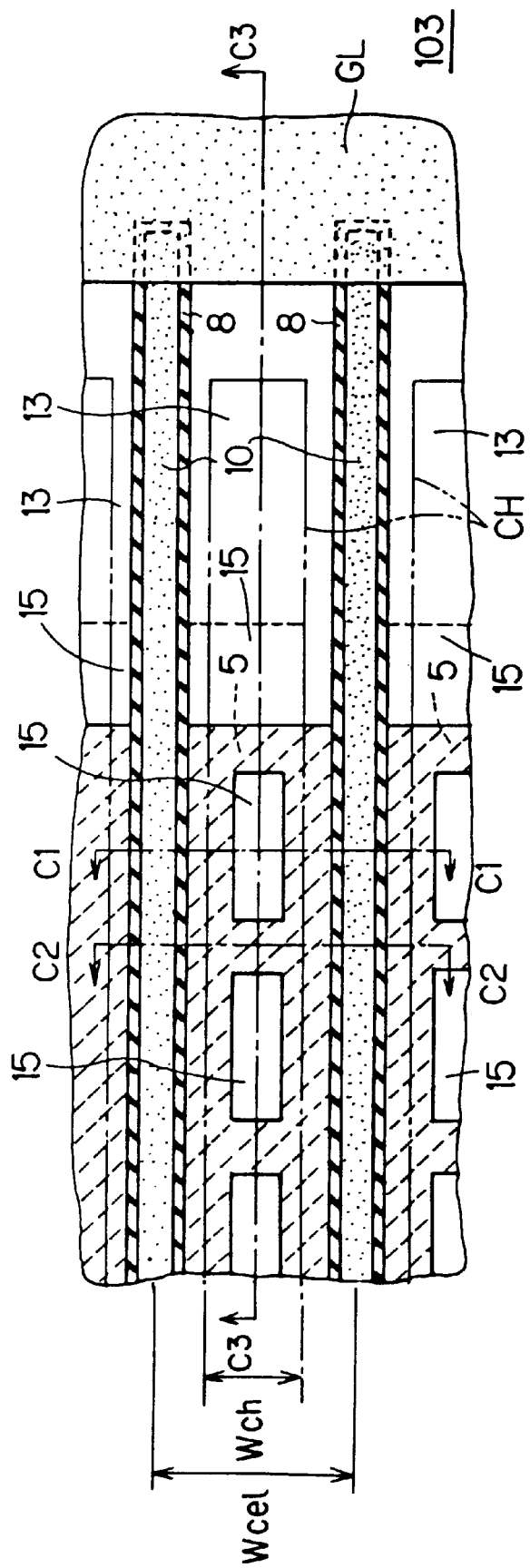
FIGS. 21 to 23 are cross sectional views of the device according to the third preferred embodiment of the present invention.
Figure 22:
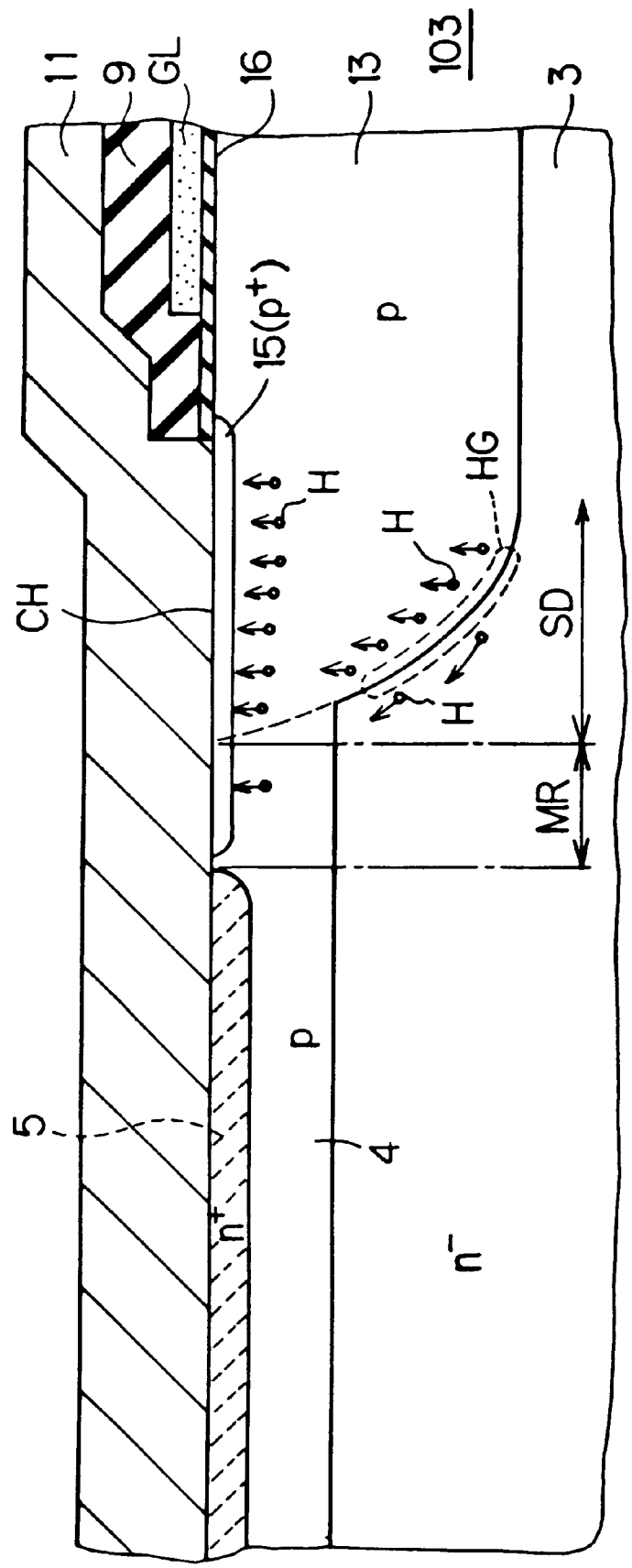
Figure 23:
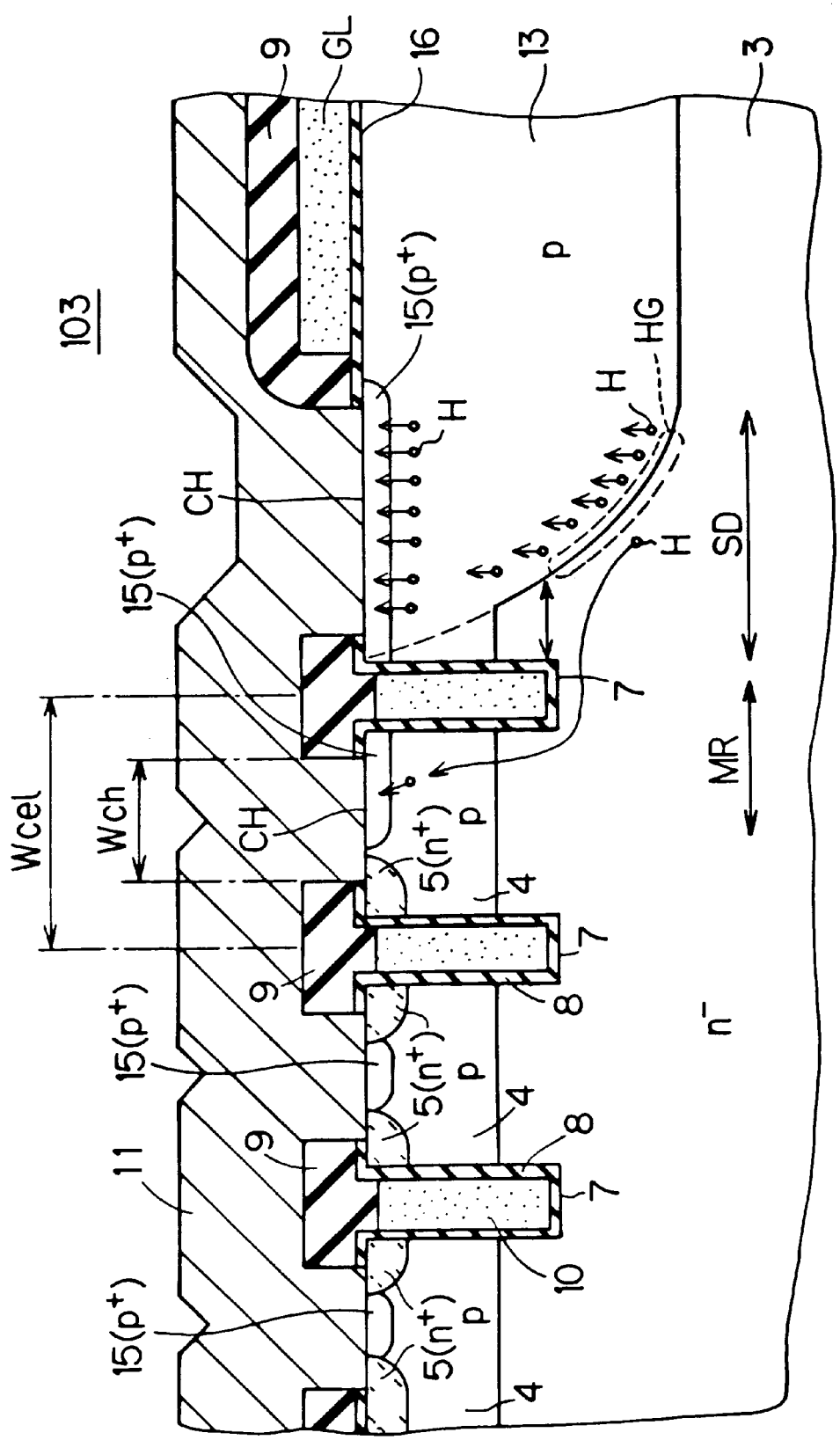

FIGS. 21, 22 and 23 are cross sectional views showing a structure in the vicinity of a boundary between the cell region CR and the gate wire region GR within the device 103. Of FIGS. 21, 22 and 23, FIG. 21 is a cross sectional view showing the top major surface of the semiconductor base 200 in the vicinity of the cutting plane line C3—C3 of FIG. 2. FIG. 22 is a cross sectional view taken along the cutting plane line C3—C3. FIG. 23 is a cross sectional view taken along the cutting plane line C4—C4.

As shown in FIGS. 21, 22 and 23, the device 103 is characteristically different from the devices 101 and 102 in that the $p^+$ layer 15 is formed not only in the exposed surface of the p base layer 4 which is surrounded by the $n^+$ emitter layer 5, but also in a top surface portion surrounded at least by the contact holes CH of the region of the p base layer 4 which corresponds to the margin region MR, and further in a top surface portion surrounded at least by the contact holes CH of the side diffusion region SD. The impurity concentration the $p^+$ layer 15 is set higher than that of any one of the p base layer 4 and the $n^+$ emitter layer 5.

As described above, in the device 103, the p⁺ layer 15 is formed at least in the portions which are surrounded by the contact holes CH in the top surfaces of the p base layer 4 and the side diffusion region SD. Hence, the p base layer 4 and the p semiconductor layer 13 are both connected to the emitter electrode 11 through the p⁺ layer 15 which has a high impurity concentration. As a result, contact resistances, and hence, potential barriers between the p base layer 4 and the emitter electrode 11 and between the p semiconductor layer 13 the emitter electrode 11 become low.

Hence, holes intruding into the p base layer 4 or the p semiconductor layer 13 more easily exit to the emitter electrode 11. Since this makes it easier for a current to flow, the value of a current which can be turned off becomes high. In other words, the p⁺ layer 15 improves the RBSOA within the device 103.

The device is similar to the devices 101 and 102 in that the contact holes CH are formed on the top surfaces of the side diffusion region SD and the margin region MR and in that neither the side diffusion region SD nor the margin region MR includes the n⁺ emitter layer 5. Hence, this device as well guarantees the advantage that conduction of the parasitic bipolar transistor is suppressed and the RBSOA of the device is improved, as the devices 101 and 102.

Now, a description will be given on a few preferred methods of manufacturing the device 103.

Figure 24:
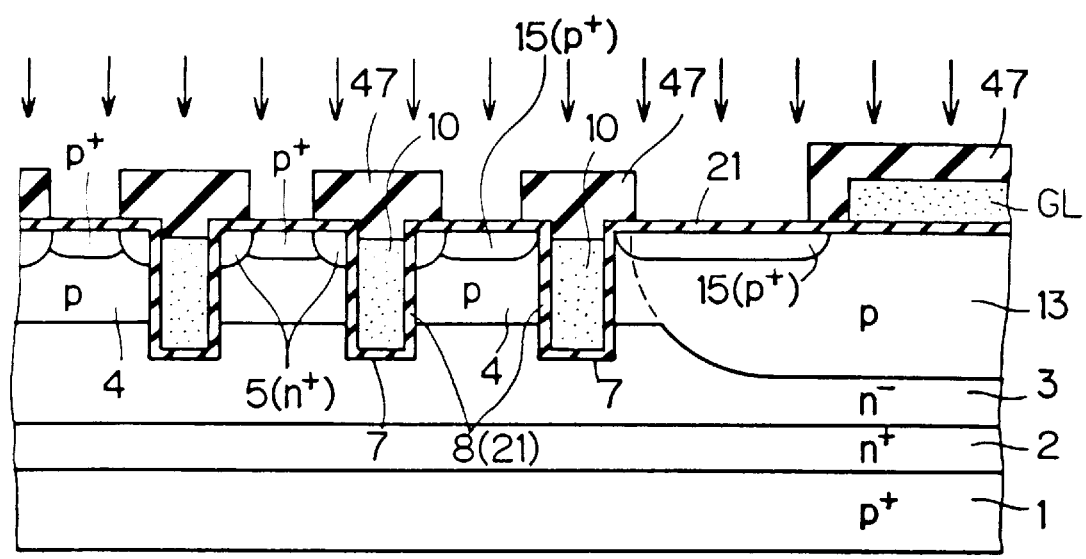
FIGS. 24 to 28 are views showing steps of manufacturing the device according to the third preferred embodiment of the present invention.

FIG. 24 is a view showing a manufacturing step of one example of a manufacturing method. In this manufacturing method, the steps shown in FIGS. 6 to 13 are executed, first. Following this, as shown in FIG. 24, a shielding element 47 is formed which covers the gate electrode 10, the n⁺ emitter layer 5 and the gate wire line GL. The shielding element 47 is obtained by depositing a material of the shielding element 47 on the entire top surface which is exposed after the step shown in FIG. 13 and thereafter performing patterning.

The shielding element 47 is selectively open within the top surface of the semiconductor base 20, i.e., in the region of the p base layer 4 which is surrounded by the n⁺ emitter layer 5, in the region of the p base layer 4 which corresponds to the margin region MR, and in the side diffusion region SD of the p semiconductor layer 13 facing the cell region CR. In other words, the shielding element 47 is selectively open in a region which includes contact holes CH which are formed at a subsequent step.

Next, using the shielding element 47 as a mask, a p-type impurity is selectively implanted into the top surface of the semiconductor base 20. Following this, by performing annealing after removing the shielding element 47, the implanted impurity is diffused. As a result, the p⁺ layer 15 is selectively formed in a top surface portion of the semiconductor base 20. The device 103 is obtained by executing the steps shown in FIGS. 14 to 17.

Figure 25:
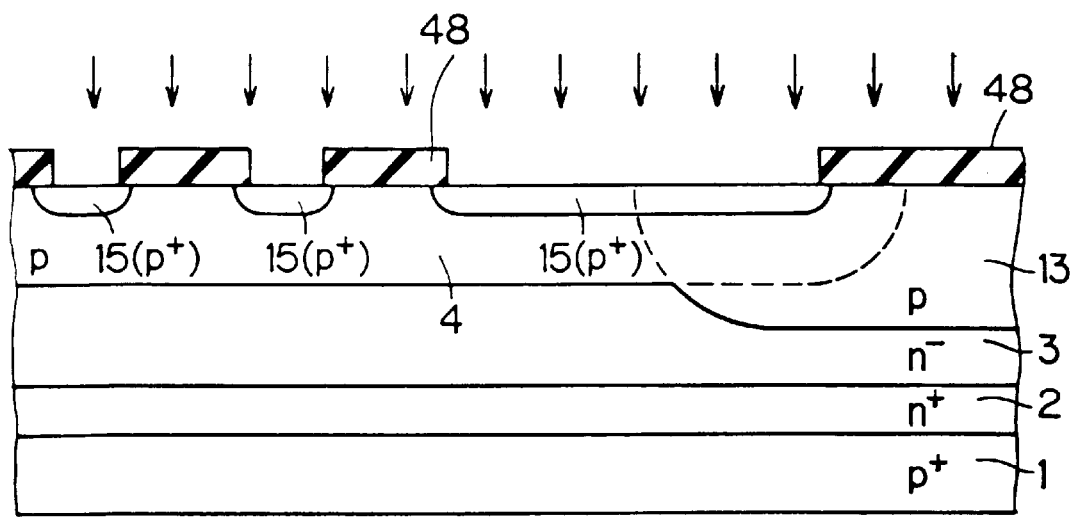
Figure 26:
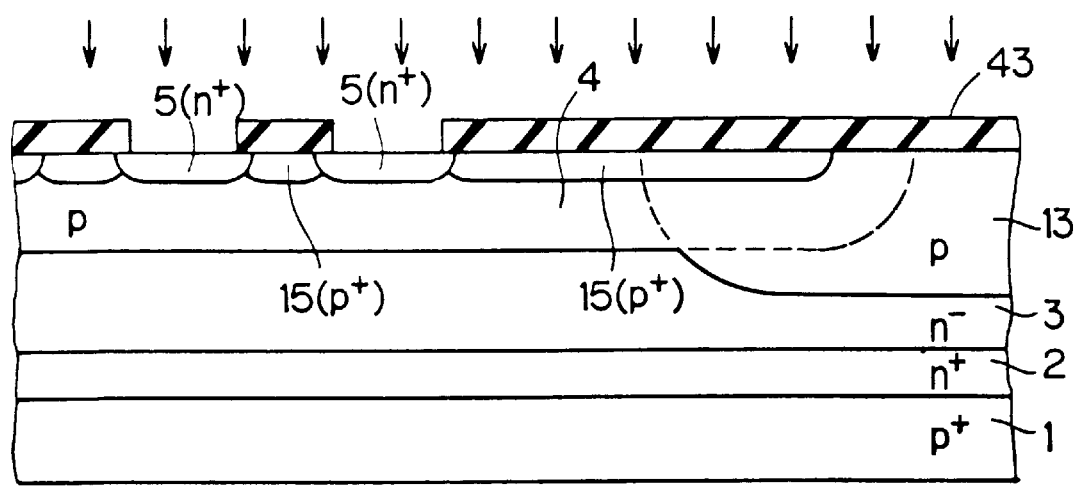

FIGS. 25 and 26 are views showing manufacturing steps of another one example of a manufacturing method. In this manufacturing method, the steps shown in FIGS. 6 to 8 are executed, first. Following this, as shown in FIG. 25, a shielding element 48 is formed which has an opening portion corresponding to the p⁺ layer 15 which is to be formed, in the top surface of the semiconductor base 20.

The shielding element 48 is selectively open within the top surface of the semiconductor base 20, i.e., in a region which is surrounded by the n⁺ emitter layer which is formed at a subsequent step, in the region of the p base layer 4 which corresponds to the margin region MR, and in the side diffusion region SD of the p semiconductor layer 13 facing the cell region CR. In other words, the shielding element 48 is selectively open in a region which includes contact holes CH which are formed at a subsequent step, which is similar to the shielding element 47.

Next, using the shielding element 48 as a mask, a p-type impurity is selectively implanted into the top surface of the semiconductor base 20. Following this, by performing annealing after removing the shielding element 48, the implanted impurity is diffused. As a result, the p⁺ layer 15 is selectively formed in a top surface portion of the semiconductor base 20.

Next, the step shown in FIG. 26 is executed. That is, the shielding element 43 is formed which has an opening portion on the p base layer 4, corresponding to the n⁺ emitter layer 5 which is to be formed. The opening portion of the shielding element 43 is formed so as not to overlap the opening portion of the shielding element 48. Using the shielding element 43 as a mask, an n-type impurity is selectively implanted.

Following this, by performing annealing after removing the shielding element 43, the implanted impurity is diffused. As a result, the n⁺ emitter layer 5 is selectively formed in the top surface of the p base layer 4. The n⁺ emitter layer 5 is formed only in a region which is separated from the side diffusion region of the p semiconductor layer 13 by a certain distance. The device 103 is obtained by subsequently executing the steps shown in FIGS. 10 to 17.

Figure 27:
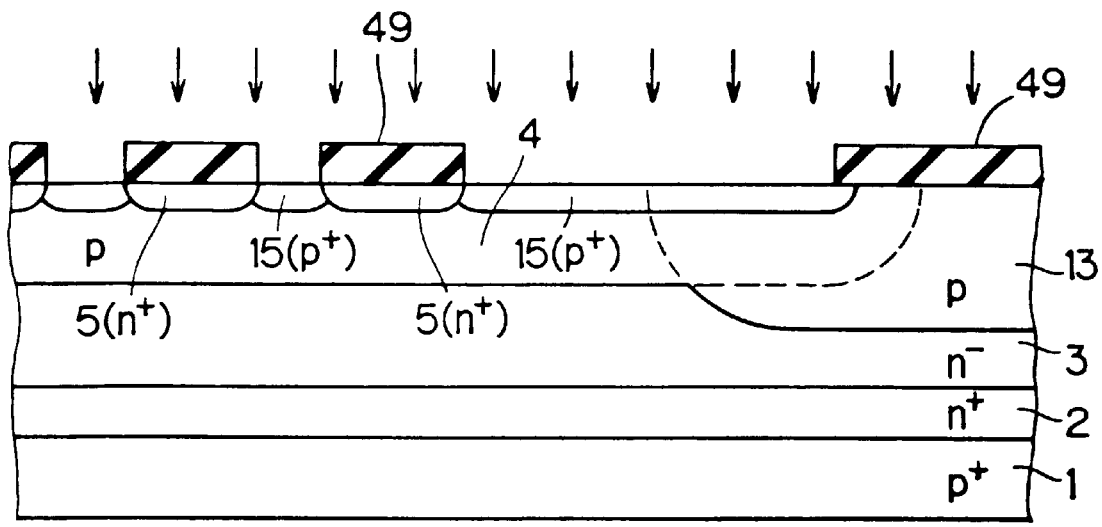

FIG. 27 is a view showing a manufacturing step of a further example of a manufacturing method. In this manufacturing method, the steps shown in FIGS. 6 to 9 are executed, first. Following this, as shown in FIG. 27, a shielding element 49 which covers the n⁺ emitter layer 5 is formed. The shielding element 49 is selectively open within the top surface of the semiconductor base 20, i.e., in the region of the p base layer 4 which is surrounded by the n⁺ emitter layer 5, in the region of the p base layer 4 which corresponds to the margin region MR, and in the side diffusion region SD of the p semiconductor layer 13 facing the cell region CR. In other words, the shielding element 49 is selectively open in a region which includes contact holes CH which are formed at a subsequent step.

Next, using the shielding element 49 as a mask, a p-type impurity is selectively implanted into the top surface of the semiconductor base 20. Following this, by performing annealing after removing the shielding element 49, the implanted impurity is diffused. As a result, the p⁺ layer 15 is selectively formed in a top surface portion of the semiconductor base 20. The device 103 is obtained by subsequently executing the steps shown in FIGS. 10 to 17.

Figure 28:
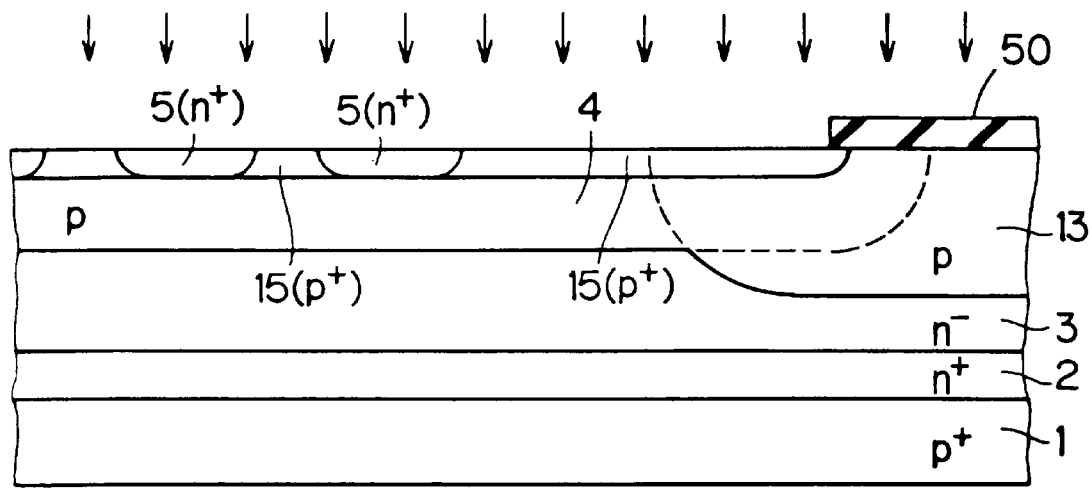

FIG. 28 is a view showing a manufacturing step of a still further example of a manufacturing method. In this manufacturing method, the steps shown in FIGS. 6 to 9 are executed, first. Following this, as shown in FIG. 28, a shielding element 50 which covers a region where the gate wire line GL is disposed at a subsequent step is formed. Next, using the shielding element 50 as a mask, a p-type impurity is selectively implanted into the top surface of the semiconductor base 20.

Following this, by performing annealing after removing the shielding element 50, the implanted impurity is diffused. As a result, the p⁺ layer 15 is selectively formed in a top surface portion of the semiconductor base 20. In this manufacturing method, the quantity of the impurity to be implanted is adjusted so that the concentration of the p-type impurity within the p⁺ layer 15 is sufficiently lower than the concentration of the n-type impurity within the n⁺ emitter layer 5. Hence, the n⁺ emitter layer 5 which is already formed is not substantially subjected to an influenced by the p-type impurity.

Following this, the steps shown in FIGS. 10 to 17 are executed, whereby the device 103 is obtained.

In any one of the four manufacturing methods described above, as in the manufacturing methods for manufacturing the devices 101 and 102, the device 103 is manufactured easily by combining common wafer processes which mainly perform deposition, impurity implantation and diffusion. In the method which is shown in FIG. 28, in particular, since it is not necessary to align the shielding element which is used to implant a p-type impurity to the n$^+$ emitter layer 5, manufacturing is particularly easy.

<4. Modification>

(1) While the preferred embodiments described above have been described in relation to an n-channel type IGBT, the present invention is also applicable to a p-channel type IGBT. A p-channel type IGBT is obtained by reversing the conductivity types of the respective semiconductor layers which form each n-channel type IGBT in each one of the preferred embodiments described.

(2) While the preferred embodiments described above have been described in relation to an IGBT, the present invention is also applicable to a semiconductor device which has a trench gate, in general. For instance, in each IGBT in each one of the preferred embodiments described, by omitting the p$^+$ collector layer 1 and forming the collector electrode 12 directly in the surface of the n$^+$ buffer layer 2, a MOSFET is obtained. In this MOSFET as well as in each IGBT in each one of the preferred embodiments described, conduction of a parasitic bipolar transistor is suppressed, and therefore, the RBSOA of the device is improved.

While the invention has been described in detail, the foregoing description is in all aspects illustrative and not restrictive. It is understood that numerous other modifications and variations can be devised without departing from the scope of the invention.

What is claimed is:

1. An insulated gate semiconductor device comprising a semiconductor base defining a top major surface and a bottom major surface, wherein said semiconductor base includes:

a first semiconductor layer of a first conductivity type being exposed to said top major surface;

a second semiconductor layer of a second conductivity type being formed in a portion of said top major surface within said first semiconductor layer;

a third semiconductor layer of the second conductivity type formed in a portion of said top major surface within said first semiconductor layer by selectively diffusing an impurity, said third semiconductor layer being deeper than said second semiconductor layer, said third semiconductor layer being linked to said second semiconductor layer, said third semiconductor layer surrounding said second semiconductor layer; and a fourth semiconductor layer of the first conductivity type being selectively formed in a portion of said top major surface within said second semiconductor layer, in said semiconductor base, a trench is formed which is open in said top major surface, which penetrates said fourth and said second semiconductor layers and which reaches said first semiconductor layer, said device further comprises:

a gate insulation film which ensures electric insulation, said gate insulation film covering an inner wall of said trench;

a gate electrode which is buried within said trench, with said gate insulation film located between said gate electrode and said semiconductor base;

a gate wire line which is disposed on said top major surface through an insulation film so as to extend along said third semiconductor layer, said gate wire line being electrically connected to said gate electrode;

a first major electrode which is disposed on said top major surface, said first major electrode being electrically connected to said second and said fourth semiconductor layers; and a second major electrode which is disposed on said bottom major surface, said second major electrode being electrically connected to said bottom major surface, said first major electrode is also electrically connected to a side diffusion region which is adjacent to said second semiconductor layer within said third semiconductor layer and has a convexly sloping diffusion structure on a side of said side diffusion region which is adjacent to said second semiconductor layer, and said fourth semiconductor layer is not formed within said side diffusion region.

2. The insulated gate semiconductor device of claim 1, wherein said first major electrode is also electrically connected to a margin region which is defined as a region within a certain distance from said side diffusion region in said second semiconductor layer, and said fourth semiconductor layer is not formed within said margin region, either.

3. The insulated gate semiconductor device of claim 2, wherein said certain distance is approximately equal to or smaller than 50 $\mu$m.

4. The insulated gate semi conductor device of claim 1, where in said trench is divided into a plurality of unit trenches which are arranged parallel to each other and equidistant from each other.

5. The insulated gate semiconductor device of claim 1 wherein, referring to said trench as a first trench, to said gate insulation film as a first gate insulation film, and to said gate electrode as a first gate electrode, said semiconductor device further comprises:

a second trench formed in said semiconductor base and which is open in said top major surface and is located in said third semiconductor layer in parallel to said first trench;

a second gate insulation film which ensures electric insulation, said second gate insulation film covering an inner wall of said second trench; and a second date electrode which is buried within said second trench, with said second gate insulation film located between said second gate electrode and said semiconductor base, wherein said gate wire line is connected to said second gate electrode.

6. The insulated gate semiconductor device of claim 1, wherein an edge portion of said trench along the longitudinal direction of said trench extends into said third semiconductor layer.

7. The insulated gate semiconductor device of claim 1, wherein said semiconductor base further includes a fifth semiconductor layer which is selectively formed in a connection portion of said second and said third semiconductor layers with said first major electrode, said fifth semiconductor layer having a higher impurity concentration than those of said second and said third semiconductor layers.

8. The insulated gate semiconductor device of claim 1, wherein said fourth semiconductor layer is exposed to regions which are located between said plurality of unit trenches within said top major surface, so as to be in a ladder-like configuration which is adjacent to said plurality of unit trenches.

9. The insulated gate semiconductor device of claim 1, wherein said semiconductor base further includes a sixth semiconductor layer of the second conductivity type, and said sixth semiconductor layer is jointed to said first semiconductor layer and exposed to said bottom major surface.

10. The insulated gate semiconductor device of claim 9, wherein said first semiconductor layer includes a seventh semiconductor layer of the first conductivity type in a junction portion with said sixth semiconductor layer, and said seventh semiconductor layer has a higher impurity concentration than that of a remaining portion of said first semiconductor layer.

\* \* \* \* \*